United States Patent
Wagner et al.

(10) Patent No.: US 7,602,856 B2
(45) Date of Patent: Oct. 13, 2009

(54) MIXER FOR MIXING A SIGNAL AND METHOD FOR MIXING A SIGNAL

(75) Inventors: Carmen Wagner, Langensendelbach (DE); Holger Stadali, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 624 days.

(21) Appl. No.: 11/302,749

(22) Filed: Dec. 13, 2005

(65) Prior Publication Data

US 2006/0159207 A1 Jul. 20, 2006

(30) Foreign Application Priority Data

Dec. 13, 2004 (DE) ........................ 10 2004 059 980

(51) Int. Cl.
*H04L 27/00* (2006.01)
(52) U.S. Cl. ........................ 375/295; 375/316; 375/132; 708/204
(58) Field of Classification Search ................. 375/316, 375/295, 132; 708/204
See application file for complete search history.

(56) References Cited

U.S. PATENT DOCUMENTS

| | | | |
|---|---|---|---|
| 4,803,703 | A | 2/1989 | DeLuca et al. |
| 6,009,334 | A | 12/1999 | Grubeck et al. |
| 6,424,683 | B1 | 7/2002 | Schoellhorn |
| 2003/0053558 | A1* | 3/2003 | Unger et al. ................ 375/316 |
| 2003/0128161 | A1 | 7/2003 | Oh et al. |
| 2003/0215035 | A1 | 11/2003 | Amerga et al. |
| 2003/0227895 | A1 | 12/2003 | Strutt et al. |
| 2004/0072579 | A1 | 4/2004 | Hottinen |
| 2004/0203871 | A1 | 10/2004 | Geier et al. |

FOREIGN PATENT DOCUMENTS

| | | |
|---|---|---|
| DE | 198 02 373 C1 | 1/1998 |
| DE | 19802373 C1 | 1/1998 |
| EP | 0 930 704 A2 | 11/1998 |
| EP | 0 933 882 | 8/1999 |
| EP | 1 089 452 | 4/2001 |
| EP | 1089452 A1 | 4/2001 |
| EP | 1206068 A2 | 5/2002 |
| WO | WO 03/001699 | 1/2003 |

(Continued)

OTHER PUBLICATIONS

Frerking, M. Digital Signal Processing in Communication Systems.

(Continued)

*Primary Examiner*—Sudhanshu C Pathak
(74) *Attorney, Agent, or Firm*—Michael A. Glenn; Glenn Patent Group

(57) ABSTRACT

A mixer for mixing a signal, present as a sequence of time-discrete values with a time interval between two time-discrete values defining a first sampling frequency from a current frequency to a target frequency, includes a first mixer implemented to convert the signal from the current frequency to an intermediate frequency to obtain an intermediate frequency signal based on the first sampling frequency, wherein a spectral interval between the intermediate frequency and the current frequency depends on the first sampling frequency. Further, the mixer includes means for converting the intermediate frequency signal into a converted intermediate frequency signal which is based on a second sampling frequency. Additionally, the mixer includes a second mixer which is implemented to convert the converted intermediate frequency signal from the intermediate frequency to the target frequency to obtain a target frequency signal which is based on the sampling frequency.

32 Claims, 26 Drawing Sheets

FOREIGN PATENT DOCUMENTS

WO    WO 2005/098465 A2    10/2005

OTHER PUBLICATIONS

Li, Xinrong, et al.; Super-Resolution TOA Estimation With Diversity for Indoor Geolocation; Jan. 1, 2004; IEEE.

Harris, F. Multirate Signal Processing for Communication Systems. May 14, 2004. Prentice Hall. p. 400-407.

Fliege, N. Multiraten-signalverarbeitung. 1993. Germany. p. 256-258.

Harris, F. Multirate Signal Processing for Communication systems: 2004. Prentice Hall. ISBE 0-13-146511-2, p. 403-407.

Fliege, N. Multiraten-Signalverarbeitung. 1993. Stuttgart, Teubner Verlag. ISBN 3-519-06155-4. p. 256-258.

\* cited by examiner

|  | POSITIVE FREQUENCY SHIFT | | NEGATIVE FREQUENCY SHIFT | |
|---|---|---|---|---|
| TIME INDEX n | cos(nπ/2) | sin(nπ/2) | cos(-nπ/2) | sin(-nπ/2) |
| 0 | 1 | 0 | 1 | 0 |
| 1 | 0 | 1 | 0 | -1 |
| 2 | -1 | 0 | -1 | 0 |
| 3 | 0 | -1 | 0 | 1 |

FIGURE 3

| TIME INDEX n | POSITIVE FREQUENCY SHIFT | | NEGATIVE FREQUENCY SHIFT | |
|---|---|---|---|---|
| | Re{y[n]} | Im{y[n]} | Re{y[n]} | Im{y[n]} |
| 0 | i[0] | q[0] | i[0] | q[0] |
| 1 | -q[1] | i[1] | q[1] | -i[1] |
| 2 | -i[2] | -q[2] | -i[2] | -q[2] |
| 3 | q[3] | -i[3] | -q[3] | i[3] |
| 4 | i[4] | q[4] | i[4] | q[4] |
| 5 | -q[5] | i[5] | q[5] | -i[5] |
| 6 | -i[6] | -q[6] | -i[6] | -q[6] |
| 7 | q[7] | -i[7] | -q[7] | i[7] |
| 8 | i[8] | q[8] | i[8] | q[8] |
| 9 | -q[9] | i[9] | q[9] | -i[9] |
| 10 | -i[10] | -q[10] | -i[10] | -q[10] |
| 11 | q[11] | -i[11] | -q[11] | i[11] |
| 12 | i[12] | q[12] | i[12] | q[12] |
| 13 | -q[13] | i[13] | q[13] | -i[13] |

FIGURE 4

| | |
|---|---|
| -0,00161106077678 | $=a_0$ |
| -0,00234731818860 | $=a_1$ |
| -0,00173182413480 | $=a_2$ |
| 0,00000000000004 | $=a_3$ |
| 0,00720377784510 | $=a_4$ |
| 0,01062413762642 | $=a_5$ |
| 0,00794256839925 | $=a_6$ |
| -0,00000000000012 | $=a_7$ |
| -0,02082456810098 | $=a_8$ |
| -0,03123125277165 | $=a_9$ |
| -0,02379167980953 | $=a_{10}$ |
| 0,00000000000023 | $=a_{11}$ |
| 0,04899080088419 | $=a_{12}$ |
| 0,07554931686914 | $=a_{13}$ |
| 0,05947272350759 | $=a_{14}$ |
| -0,00000000000036 | $=a_{15}$ |
| -0,10789013643074 | $=a_{16}$ |
| -0,17670997703090 | $=a_{17}$ |
| -0,15044737627148 | $=a_{18}$ |
| 0,00000000000047 | $=a_{19}$ |
| 0,29590602436736 | $=a_{20}$ |
| 0,62395779269402 | $=a_{21}$ |
| 0,88655696509758 | $=a_{22}$ |
| 0,99999999999949 | $=a_{23}$ |
| 0,88655696509758 | $=a_{24}$ |
| 0,62395779269402 | $=a_{25}$ |
| 0,29590602436736 | $=a_{26}$ |
| 0,00000000000047 | $=a_{27}$ |
| -0,15044737627148 | $=a_{28}$ |
| -0,17670997703090 | $=a_{29}$ |
| -0,10789013643074 | $=a_{30}$ |
| -0,00000000000036 | $=a_{31}$ |
| 0,05947272350759 | $=a_{32}$ |
| 0,07554931686914 | $=a_{33}$ |
| 0,04899080088419 | $=a_{34}$ |
| 0,00000000000023 | $=a_{35}$ |
| -0,02379167980953 | $=a_{36}$ |
| -0,03123125277165 | $=a_{37}$ |
| -0,02082456810098 | $=a_{38}$ |
| -0,00000000000012 | $=a_{39}$ |
| 0,00794256839925 | $=a_{40}$ |
| 0,01062413762642 | $=a_{41}$ |
| 0,00720377784510 | $=a_{42}$ |
| 0,00000000000004 | $=a_{43}$ |
| -0,00173182413480 | $=a_{44}$ |
| -0,00234731818860 | $=a_{45}$ |
| -0,00161106077678 | $=a_{46}$ |

FIGURE 9

| SIGNALS | WORD WIDTH | DATA RATE | DATA TYPE |
|---|---|---|---|
| Net27 | tbd | B_clock | komplex |
| Net1 | tbd | B_clock | komplex |
| Net17 | tbd | B_clock | komplex |
| Net16 | tbd | B_clock | komplex |
| Net12 | tbd | B_clock_4 | komplex |
| Net13 | tbd | B_clock_4 | komplex |
| Net15 | tbd | B_clock_4 | komplex |
| Net18 | tbd | B_clock_4 | komplex |
| Net19 | tbd | B_clock_4 | komplex |
| Net20 | tbd | B_clock_4 | komplex |
| Net21 | tbd | B_clock_4 | komplex |
| Net22 | tbd | B_clock_4 | komplex |
| Net23 | tbd | B_clock_4 | komplex |
| Net24 | tbd | B_clock_4 | komplex |
| Net25 | tbd | B_clock_4 | komplex |
| Net26 | tbd | B_clock_4 | komplex |
| Net28 | tbd | B_clock_16 | komplex |
| Net29 | tbd | B_clock_16 | komplex |
| Net30 | tbd | B_clock_16 | komplex |
| Net31 | tbd | B_clock_16 | komplex |
| Net32 | tbd | B_clock_16 | komplex |
| Net33 | tbd | B_clock_16 | komplex |
| Net34 | tbd | B_clock_16 | komplex |
| Net35 | tbd | B_clock_16 | komplex |
| Net36 | tbd | B_clock_16 | komplex |

FIGURE 12

| INPUT SIGNAL | OUTPUT SIGNAL | PARAMETER fs_shift_1 |
|---|---|---|
| Net12 | Net18 | -1 |
| Net12 | Net19 | 0 |
| Net12 | Net20 | 1 |
| Net13 | Net21 | -1 |
| Net13 | Net22 | 0 |
| Net13 | Net23 | 1 |
| Net15 | Net24 | -1 |
| Net15 | Net25 | 0 |
| Net15 | Net26 | 1 |

FIGURE 13

| SIGNALS | WORD WIDTH | DATA RATE | DATA TYPE |
|---|---|---|---|
| Net6 | tbd | B_clock / B_clock_4 | komplex |
| Net8 | tbd | B_clock_4 / B_clock_16 | komplex |
| Net9 | tbd | B_clock_4 / B_clock_16 | komplex |
| Net10 | tbd | B_clock_4 / B_clock_16 | komplex |
| Net11 | tbd | B_clock_4 / B_clock_16 | komplex |
| Net12 | tbd | B_clock_4 / B_clock_16 | komplex |
| Net14 | tbd | B_clock_4 / B_clock_16 | komplex |
| Net15 | tbd | B_clock_4 / B_clock_16 | komplex |
| Net13 | tbd | B_clock_4 / B_clock_16 | komplex |
| Net7 | tbd | B_clock_4 / B_clock_16 | komplex |

FIGURE 15

| TIME INDEX n | $a_0$ | $a_1$ | $a_2$ | $a_3$ | $a_4$ | $a_5$ |
|---|---|---|---|---|---|---|
| 0 | $x_0$ | 0 | 0 | 0 | 0 | 0 |
| 1 | $x_1$ | $x_0$ | 0 | 0 | 0 | 0 |
| 2 | $x_2$ | $x_1$ | $x_0$ | 0 | 0 | 0 |
| 3 | $x_3$ | $x_2$ | $x_1$ | $x_0$ | 0 | 0 |
| 4 | $x_4$ | $x_3$ | $x_2$ | $x_1$ | $x_0$ | 0 |
| 5 | $x_5$ | $x_4$ | $x_3$ | $x_2$ | $x_1$ | $x_0$ |
| 6 | $x_6$ | $x_5$ | $x_4$ | $x_3$ | $x_2$ | $x_1$ |
| 7 | $x_7$ | $x_6$ | $x_5$ | $x_4$ | $x_3$ | $x_2$ |
| 8 | $x_8$ | $x_7$ | $x_6$ | $x_5$ | $x_4$ | $x_3$ |
| 9 | $x_9$ | $x_8$ | $x_7$ | $x_6$ | $x_5$ | $x_4$ |

FIGURE 16

| TIME INDEX n (OF THE NEW SAMPLING RATE) | ... | 3 | 2 | 1 | 0 | | POLYPHASE FILTER | |
|---|---|---|---|---|---|---|---|---|
| POLYPHASE 1 | . | $x_{12}$ | $x_8$ | $x_4$ | $x_0$ | => | $a_0$ | $a_4$ |
| POLYPHASE 2 | . | $x_{11}$ | $x_7$ | $x_3$ | 0 | | $a_1$ | $a_5$ |
| POLYPHASE 3 | . | $x_{10}$ | $x_6$ | $x_2$ | 0 | | $a_2$ | 0 |
| POLYPHASE 4 | . | $x_{09}$ | $x_5$ | $x_1$ | 0 | | $a_3$ | 0 |

FIGURE 17

| TIME INDEX n (OF THE NEW SAMPLING RATE) | . | 3 | 2 | 1 | 0 | | POLYPHASE FILTER | |
|---|---|---|---|---|---|---|---|---|
| POLYPHASE 1 (re) | . | $i_{12}$ | $i_8$ | $i_4$ | $i_0$ | => | $a_0$ | $a_4$ |
| POLYPHASE 2 (re) | . | $q_{11}$ | $q_7$ | $q_3$ | 0 | | $a_1$ | $a_5$ |
| POLYPHASE 3 (re) | . | $-i_{10}$ | $-i_6$ | $-i_2$ | 0 | | $a_2$ | 0 |
| POLYPHASE 4 (re) | . | $-q_{09}$ | $-q_5$ | $-q_1$ | 0 | | $a_3$ | 0 |
| | | | | | | | $\Sigma$ | |

FIGURE 19

| TIME INDEX n (OF THE NEW SAMPLING RATE) | ... | 3 | 2 | 1 | 0 | | POLYPHASE FILTER | |
|---|---|---|---|---|---|---|---|---|
| POLYPHASE 1 (im) | . | $q_{12}$ | $q_8$ | $q_4$ | $q_0$ | => | $a_0$ | $a_4$ |
| POLYPHASE 2 (im) | . | $-i_{11}$ | $-i_7$ | $-i_3$ | 0 | | $a_1$ | $a_5$ |
| POLYPHASE 3 (im) | . | $-q_{10}$ | $-q_6$ | $-q_2$ | 0 | | $a_2$ | 0 |
| POLYPHASE 4 (im) | . | $i_{09}$ | $i_5$ | $i_1$ | 0 | | $a_3$ | 0 |
| | | | | | | | $\Sigma$ | |

FIGURE 20

| TIME INDEX n (OF THE NEW SAMPLING RATE) | ... | 3 | 2 | 1 | 0 | ⇒ | POLYPHASE FILTER | |
|---|---|---|---|---|---|---|---|---|
| POLYPHASE 1 (re) | | $i_{12}$ | $i_8$ | $i_4$ | 0 | | $a_0$ | $a_4$ |
| POLYPHASE 2 (im) | | $-i_{11}$ | $-i_7$ | $-i_3$ | $i_0$ | | $a_1$ | $a_5$ |
| POLYPHASE 3 (re) | | $-i_{10}$ | $-i_6$ | $-i_2$ | 0 | | $a_2$ | 0 |
| POLYPHASE 4 (im) | | $i_9$ | $i_5$ | $i_1$ | 0 | | $a_3$ | 0 |
| POLYPHASE 1 (im) | | $q_{12}$ | $q_8$ | $q_4$ | $q_0$ | | $a_0$ | $a_4$ |
| POLYPHASE 2 (re) | | $q_{11}$ | $q_7$ | $q_3$ | 0 | | $a_1$ | $a_5$ |
| POLYPHASE 3 (im) | | $-q_{10}$ | $-q_6$ | $-q_2$ | 0 | | $a_2$ | 0 |
| POLYPHASE 4 (re) | | $-q_9$ | $-q_5$ | $-q_1$ | 0 | | $a_3$ | 0 |
| | | | | | | REAL PART | Σ | |
| | | | | | | IMAGINARY PART | Σ | |

FIGURE 21

| TIME INDEX n (OF THE NEW SAMPLING RATE) | 3 | 2 | 1 | 0 | | POLYPHASE FILTER | RESULT OF THE FILTERS |
|---|---|---|---|---|---|---|---|
| POLYPHASE 1 (re) | $i_{12}$ | $i_8$ | $i_4$ | $i_0$ | > | POLY FIR 1 | RE P OUT 1 |
| POLYPHASE 2 (im) | $i_{11}$ | $i_7$ | $i_3$ | 0 | | POLY FIR 2 | RE P OUT 2 |
| POLYPHASE 3 (re) | $i_{10}$ | $i_6$ | $i_2$ | 0 | | POLY FIR 3 | RE P OUT 3 |
| POLYPHASE 4 (im) | $i_9$ | $i_5$ | $i_1$ | 0 | | POLY FIR 4 | RE P OUT 4 |
| POLYPHASE 1 (im) | $q_{12}$ | $q_8$ | $q_4$ | $q_0$ | | POLY FIR 1 | IM P OUT 1 |
| POLYPHASE 2 (re) | $q_{11}$ | $q_7$ | $q_3$ | 0 | | POLY FIR 2 | IM P OUT 2 |
| POLYPHASE 3 (im) | $q_{10}$ | $q_6$ | $q_2$ | 0 | | POLY FIR 3 | IM P OUT 3 |
| POLYPHASE 4 (re) | $q_9$ | $q_5$ | $q_1$ | 0 | | POLY FIR 4 | IM P OUT 4 |

FIGURE 22

NO FREQUENCY SHIFT

REAL PART = Σ(RE_P_OUT_1, RE_P_OUT_2, RE_P_OUT_3, RE_P_OUT_4)

IMAGINARY PART = Σ(IM_P_OUT_1, IM_P_OUT_2, IM_P_OUT_3, IM_P_OUT_4)

FREQUENCY SHIFT IN THE POSITIVE DIRECTION

REAL PART = Σ(RE_P_OUT_1, IM_P_OUT_2, -RE_P_OUT_3, -IM_P_OUT_4)

IMAGINARY PART = Σ(IM_P_OUT_1, -RE_P_OUT_2, -IM_P_OUT_3, RE_P_OUT_4)

FREQUENCY SHIFT IN THE NEGATIVE DIRECTION

REAL PART = Σ(RE_P_OUT_1, -IM_P_OUT_2, -RE_P_OUT_3, IM_P_OUT_4)

IMAGINARY PART = Σ(IM_P_OUT_1, RE_P_OUT_2, -IM_P_OUT_3, -RE_P_OUT_4)

FIGURE 23

MIXER FOR MIXING A SIGNAL AND METHOD FOR MIXING A SIGNAL

BACKGROUND OF THE INVENTION

1. Field of the Invention

The present invention relates to a mixer for mixing signals and, in particular, the present invention relates to a digital mixer for converting a signal from a frequency band into another frequency band, wherein the digital mixer may, for example, be used in telecommunications.

2. Description of the Related Art

In telecommunications, to shift a signal from a current frequency (current frequency) into a higher transmission frequency (target frequency), mainly mixers are used. For such a shifting, for example in the transmitter several different possibilities are possible. First, a signal having a low bandwidth $B_{low}$ may be shifted to different center frequencies within a large bandwidth B. If this center frequency is constant over a longer period of time, then this means nothing but the selection of a subband within the larger frequency band. Such a proceeding is referred to as "tuning". If the center frequency to which the signal is to be shifted varies relatively fast, such a system is referred to as a frequency-hopping system or a spread-spectrum system. As an alternative, also within a large bandwidth B several transmission signals may be emitted in parallel in the frequency multiplexer with a respectively low bandwidth $B_{low}$.

Analog to these proceedings in the transmitter, the respective receivers are to be implemented accordingly. This means on the one hand that a subband of the large bandwidth B is to be selected when the center frequency of the transmitted signal is constant over a longer period of time. The tuning is then performed to the predetermined center frequency. If the center frequency is varied relatively fast, as it is the case with a frequency-hopping system, also in the receiver a fast temporal change of the center frequency of the transmitted signal has to take place. If several transmit signals have been sent out in parallel in the frequency multiplexer, also a parallel reception of those several frequency-multiplexed signals within the larger bandwidth B has to take place.

Conventionally, for an above-indicated tuning system and a frequency-hopping system an analog or digital mixer is used, wherein the digital mixing conventionally takes place with one single mixer stage. In an analog mixer, a high expense in circuit technology is necessary, as for a precise mixing to the target frequency highly accurate mixer members are required which substantially increase the costs of the transmitter to be manufactured. It is to be noted with regard to a digital mixer that in certain respects a high expense in terms of circuit engineering (or numerics, respectively) is required when the signal is to be mixed onto a freely selectable random target frequency.

Conventional mixers may here be implemented similar to the mixer device 2400, as it is illustrated in FIG. 24 in the form of a downsampling mixer. The mixer device 2400 includes a mixer 2402, a low-pass filter 2404 and a sampling rate mixer 2406. The mixer 2402 comprises an input 2408 for receiving a signal 2410 to be mixed. Further, the mixer 2402 comprises an output 2412 for outputting the signal 2414 converted from the current frequency to an intermediate frequency which is supplied to the low-pass filter 2404 via an input 2416 of the same. Further, the low-pass filter 2404 comprises an output 2418 for outputting a frequency-converted low-pass-filtered signal 2420 which is supplied to the sampling rate mixer 2406 via an input 2422 of the same. The sampling rate mixer 2406 includes an output 2424 for outputting a sampling rate-converted signal 2426 which is simultaneously the output signal output from the mixer device 2400.

If now the start signal 2410 having the current frequency is supplied to the mixer device 2400, wherein the start signal 2410 is based on a first sampling frequency defined by an interval of two time-discrete signal values, a conversion of the current frequency to an intermediate frequency is performed by the mixer 2402, whereupon the intermediate frequency signal 2414 results. In this intermediate frequency signal 2414, however, only the frequency on which the start signal 2410 is located (i.e. the current frequency) is converted to an intermediate frequency; the sampling frequency was not changed by the mixer 2402. In a suitable selection of the current frequency and the sampling frequency, in a simple way with regard to numerics or circuit engineering, a mixing onto the intermediate frequency signal 2414 having the intermediate frequency may be realized. If the spectral interval between the current frequency and the intermediate frequency of the (complex) signal 2410 is a quarter of the sampling frequency regarding its magnitude, then a mixing may be performed by a multiplication with the values 1, i, −1 and −i, or even more simply, merely by a negation of real part or imaginary part values of the start signal 2410 as well as by an exchange of real and imaginary part values of signal values of the start signal 2410.

Subsequently, a low-pass filtering of the intermediate frequency signal 2414 with the first sampling frequency is performed by the low-pass filter 2404, whereupon a low-pass-filtered intermediate frequency signal 2420 results which is again based on the first sampling frequency. By the sampling rate mixer 2406, a downsampling of the low-pass-filtered intermediate frequency signal 2402 takes place. This leads, for example, to a reduction of the sampling frequency without further spectrally converting the signal. An above-described mixer 2402 which is simple to be implemented regarding numerics or hardware engineering is, for example, described in Marvin E. Frerking, Digital Signal Processing in Communication Systems, Kluwer Academic Publishers.

Such an approach of a mixer 2402 which may easily be realized in terms of numerics or circuit engineering has the disadvantage that by the predetermined connection between the current frequency and the sampling frequency only intermediate frequencies may be obtained which are arranged in a spectral interval of a quarter of the sampling frequency around the current frequency. This reduces the applicability of such a mixer 2402 which may efficiently be realized in terms of numerics or circuit engineering. If also intermediate frequencies are to be obtained, which comprise another interval to the current frequency than a quarter of the sampling frequency, a multiplication of the individual start signal values of the start signal 2410 with the rotating complex pointer $e^{j2\pi k f_c/f_s}$ is necessary, wherein k is a running index of the start signal values, $f_c$ is the desired center frequency (i.e. the intermediate frequency) and $f_s$ is the sampling frequency of the signal. It is to be considered, however, that in the multiplication of the start signal values with the rotating complex pointer not only purely real or purely imaginary multiplication factors, respectively, are to be used, but that the multiplication factors used comprise real and imaginary parts. By this, a solution efficient in terms of numerics and circuit engineering, as it was indicated above, may not be used. A mixer would be desired, however, which offers the possibility to perform a mixing of start signal values from a current frequency to any intermediate frequency in an efficient way in terms of numerics and circuit engineering.

For the parallel transmitting and receiving of several frequency subbands, frequently the OFDM (orthogonal frequency division multiplexing) and the related multi-carrier modulation or multi-tone modulation method, respectively, are used. The same require, by the use of the Fourier transformation, partially a substantial computing expenditure, in particular if only few of the frequency subbands from a large frequency band having many individual frequency subbands are required.

SUMMARY OF THE INVENTION

It is thus the object of the present invention to provide a mixer for mixing a signal and a method for mixing a signal by which a more simple realization is enabled with regard to numerics or circuit engineering and simultaneously a higher flexibility in the selection of the intermediate frequencies obtainable by the mixer is possible in contrast to conventional mixers.

In accordance with a first aspect, the present invention provides a mixer for mixing a signal, representing a sequence of time-discrete values with a time interval between two time-discrete values, defining a first sampling frequency, from a current frequency to a target frequency, having a first mixer which is implemented to convert the signal from the current frequency to an intermediate frequency to obtain an intermediate frequency signal which is based on the first sampling frequency, wherein a spectral interval between the intermediate frequency and the current frequency depends on the first sampling frequency; means for converting the intermediate frequency signal into a converted intermediate frequency signal, which is based on a second sampling frequency, wherein the first sampling frequency and the second sampling frequency are different from each other; and a second mixer which is implemented to convert the converted intermediate frequency signal from the intermediate frequency to the target frequency to obtain a target frequency signal which is based on the second sampling frequency, wherein a spectral interval between the target frequency and the intermediate frequency depends on the second sampling frequency.

In accordance with a second aspect, the present invention provides a method for mixing a signal present as a sequence of time-discrete values with a time interval between two time-discrete values defining a first sampling frequency of a current frequency to a target frequency, with the steps of converting the signal from the current frequency to an intermediate frequency to obtain the intermediate frequency signal which is based on the first sampling frequency, wherein a spectral interval between the intermediate frequency and the current frequency depends on the first sampling frequency; converting the intermediate frequency signal into a converted intermediate frequency signal, wherein the first sampling frequency is different from the second sampling frequency; and converting the converted intermediate frequency signal from the intermediate frequency to the target frequency to obtain a target frequency signal which is based on the second sampling frequency, wherein a spectral interval between the target frequency and the intermediate frequency depends on the second sampling frequency.

In accordance with a first aspect, the present invention provides a computer program having a program code for performing the above mentioned method, when the program runs on a computer.

The present invention is based on the finding that a simple realization regarding numerics or hardware-technology of a mixer is possible by the fact that first, using a first mixer, the signal is converted from a current frequency to an intermediate frequency to obtain an intermediate frequency signal, subsequently the intermediate frequency signal is converted into a converted intermediate frequency signal in order to perform a sampling rate change and finally, with a second mixer, the converted intermediate frequency signal is converted to the target frequency in order to obtain the target frequency signal. By such a process, in particular considering that a spectral interval between the intermediate frequency and the current frequency depends on the first sampling frequency and a spectral interval between the target frequency and the intermediate frequency depends on the second sampling frequency, it is thus possible, by such a cascaded mixer arrangement of two mixers, to achieve a clear reduction in the numerical overhead as compared to a conventional single-stage mixer arrangement.

In particular, the spectral interval between the intermediate frequency and the current frequency, in one embodiment of the present invention, may correspond to a quarter of the first sampling frequency, and the spectral interval between the target frequency and the intermediate frequency may correspond to a quarter of the second sampling frequency. In a thus implemented first mixer, using the above-mentioned characteristic in frequency shifting a mixer may be provided, wherein only a multiplication of the received signal by either a purely real or a purely imaginary value is possible, wherein the purely real or purely imaginary value should, if possible have the same magnitude. Such a simple mixing results from the application of the Euler formula considering a frequency shift by a quarter of the sampling frequency, i.e. a (positive or negative) rotation by $\pi/2$ in the plane of complex numbers. By the selection of the rotational direction, also a corresponding positive or negative frequency shift may be performed.

Further, the first mixer may comprise control means having a control input, wherein control means is implemented, in response to a signal applied to a control input in the first mixer, to cause an increase or a decrease of the intermediate frequency with regard to the current frequency or no frequency conversion of the intermediate frequency with regard to the current frequency in the first mixer. This enables a flexibly settable mixer, wherein by a simple switching of the control signal the mixing direction may be changed.

According to a further embodiment of the present invention, the signal comprises an I component having a plurality of I component values and a Q component orthogonal to the I component having a plurality of Q component values, wherein the first mixer comprises means for converting which is implemented to convert a first sequence corresponding to the I component having a first, second, third and fourth sequential member and a second sequence corresponding to the Q component having a first, second, third and fourth sequential member into a third sequence having a first, second, third and fourth sequential member and a fourth sequence having a first, second, third and fourth sequential member according to a predetermined processing regulation, wherein the sequential members of the third sequence correspond to values of an I component of the intermediate frequency signal and the sequential members of the fourth sequence correspond to values of a Q component of the intermediate frequency signal, wherein the predetermined processing regulation depends on the signal applied to the control input. A thus implemented mixer has the advantage that now, for example, by the multiplication of a purely real or purely imaginary multiplication factor (wherein the multiplication factors should preferably have the same magnitude) the sequential members of the first (i.e. the real parts of the signal values) and the second sequence (i.e. the imaginary parts of the signal values) may be converted into sequential members of the third and fourth sequence, wherein this may be performed in an efficient way with regard to numerics or circuit engineering.

Further, means for converting may be implemented according to the predetermined processing regulation to negate a sequential member of the first or the second sequence to obtain a sequential member of the third or fourth sequence. By a thus implemented mixer, for example in a digital signal processing, a multiplication by the value −1 may already be realized by the fact that only the sign of a value represented in a digital (i.e. binary) form of a sequential member has to be "flipped" or changed.

Further, means for converting may be implemented, according to the predetermined processing regulation, to allocate a negated sequential member of the first sequence to a sequential member of the fourth sequence and to allocate a negated sequential member of the second sequence to a sequential member of the third sequence. This offers the possibility of a crossover exchange, i.e. a sequential member corresponding to an element of the I component of the signal, is converted into a sequential member corresponding to a Q component of the intermediate frequency signal, and inversely also to convert a sequential member corresponding to a value of the Q component of the signal into a sequential member corresponding to a value of the I component of the intermediate frequency signal. This enables that a result is obtained by an exchange operation corresponding to a multiplication of a sequential member by a purely imaginary value. By the exchange (and possibly negation) of sequential members, thus a numerically expensive multiplication may be prevented, whereby a further reduction of the respective necessary overhead with regard to numerics or circuit engineering may be obtained.

Further, also the second mixer may be implemented according to the above-indicated implementations, whereby also a reduction of the overhead with regard to numerics or circuit engineering may be achieved.

Further, means for converting may comprise a low-pass filter. This enables suppressing possibly occurring image frequencies in the conversion of the intermediate frequency signal into the converted intermediate frequency signal, whereby the detectability of the signal in the target frequency may be substantially improved.

The low-pass filter may further be a polyphase filter, wherein the polyphase filter is then implemented to determine a plurality of different polyphase filter output signals from the signal. Such an implementation of the low-pass filter offers the advantage that, for example, an FIR low-pass filter structure (FIR=finite impulse response) may be realized efficiently, as such an fir structure then, in a polyphase shape, enables a parallelization of the FIR low pass. This enables an acceleration of the calculation of the FIR filter output value, whereby again hardware components may be operated using low clock rates, which has consequently a cost-saving effect.

Further, the polyphase filter may be implemented to determine a predetermined number of polyphase signals from a signal, wherein the predetermined number of polyphase signals is dependent on a ratio of the first sampling frequency to the second sampling frequency. This offers the advantage, apart from low-pass filtering, of simultaneously performing, using the polyphase filter, a sampling rate conversion, for example a down-conversion. To this end, for example, by a summation of the output values of the individual polyphase filters, signals may be generated which are based on the second sampling frequency when the low-pass filter splits the signal up into a plurality of polyphase signals, which corresponds to a downsampling factor.

Further, the signal may comprise an I component and a Q component orthogonal to the I component, wherein the low-pass filter includes a first low-pass subfilter and a second low-pass subfilter, wherein the first low-pass subfilter is implemented to filter the I component and wherein the second low-pass subfilter is implemented to filter the Q component, and wherein the first low-pass subfilter and the second low-pass subfilter comprise real value filter coefficients. By such a splitting-up of the low-pass filter into a first low-pass subfilter and a second low-pass subfilter, wherein both low-pass subfilters respectively only filter one part of the (complex-valued) signal, i.e. either only the I component or the Q component, it is possible to implement both low-pass subfilter real-valued, and thus cause a further reduction of the expense with regard to numerics or circuit engineering.

Further, the first low-pass subfilter may comprise a first filter coefficient set and the second low-pass subfilter may comprise a second filter coefficient set, wherein the first filter coefficient set corresponds to the second filter coefficient set. This offers the advantage of designing only one single low-pass filter for providing the desired functionality (i.e. a certain filter characteristic), wherein the designed low-pass subfilter may then be used both for filtering for the I component and also for filtering for the Q component.

Further, the signal may comprise four consecutive signal values, wherein the first mixer includes a demultiplexer for allocating one signal value each in one of four processing paths arranged in parallel, wherein at each processing path means for determining a result of a multiplication of a signal value by a multiplication factor from a set of multiplication factors is arranged, and wherein the first mixer is implemented, in response to a signal applied to the control input, to select a set of multiplication factors associated with the signal from a plurality of sets of multiplication factors. A mixer implemented that way offers the advantage of enabling an up- or down-conversion by the fact that for the up-conversion a first multiplication factor set and for the down-conversion a second multiplication factor set is provided and the mixer receives information by the signal applied to the control input as to which multiplication factor set is to be used. By such a splitting-up of the signal into four parallel processing paths, wherein in each path a calculation of a result of a multiplication of a signal value by a multiplication factor of the set of multiplication factors is performed, thus a substantial improvement of the necessary overhead with regard to numerics or circuit engineering is possible in the realization of the frequency conversion.

Further, the first mixer may comprise a first control means and the second mixer a second control means, wherein the first control means is implemented to cause a first frequency conversion and the second control means is implemented to cause a second frequency conversion, wherein a frequency conversion includes a frequency increase, a frequency decrease or no frequency change, and wherein the first frequency conversion is different from the second frequency conversion. This enables, by different combinations of down- or up-conversion settings, respectively, at the respective mixers, to realize a great number of target frequencies onto which the signal may be converted, whereby a high granularity of the realizable target frequencies may be realized. Further, a thus implemented mixer also enables a quick switching of a mixer, for example set to down-conversion, to a mixer, for example set to up-conversion, by changing the signal applied to the control input, whereby in a frequency-hopping application scenario a good applicability of the inventive mixer results.

Further, the first low-pass subfilter may include a first polyphase filter for providing a first polyphase filter signal, a second polyphase filter for providing a second polyphase filter signal, a third polyphase filter for providing a third polyphase filter signal and a fourth polyphase filter for providing a fourth polyphase filter signal, and the second low-pass subfilter may include a fifth polyphase filter for providing a fifth polyphase filter signal, a sixth polyphase filter for providing a sixth polyphase filter signal, a seventh polyphase filter for providing a seventh polyphase filter signal and an eighth polyphase filter for providing an eighth polyphase filter signal, wherein means for converting further includes means for providing a first and second output signal, and wherein means for providing is implemented to weight and sum four of the polyphase filter signals in order to provide the first output signal and to weight and sum four further polyphase filter signals to obtain the second output signal. This offers the advantage that already in the low-pass filter a frequency conversion may be performed corresponding to a frequency conversion in a mixer, whereby a further cascade-connection and thus a further refining of the resolution of the achievable target frequency or a widening of the realizable frequency spectrum is possible.

Further, the second mixer may be mixer means, comprising:
a first sub-mixer which is implemented to convert the converted intermediate frequency signal from the intermediate frequency to a second intermediate frequency to obtain a second intermediate frequency signal which is based on the second sampling frequency, wherein a spectral interval between the intermediate frequency and the second intermediate frequency depends on the second sampling frequency;
further means for converting the second intermediate frequency signal into a second converted intermediate frequency signal based on a third sampling frequency, wherein the third sampling frequency and the second sampling frequency are different from each other; and
a second sub-mixer which is implemented to convert the second converted intermediate frequency signal from the second intermediate frequency to the target frequency to obtain a target frequency signal based on the third sampling frequency, wherein a spectral interval between the target frequency and the intermediate frequency depends on the third sampling frequency.

BRIEF DESCRIPTION OF THE DRAWINGS

Preferred embodiments of the present invention are explained in more detail in the following with reference to the accompanying drawings, in which:

FIG. 3 shows a tabular illustration of values of the cosine and the sine function as they occur in a positive or negative frequency shift according to the inventive approach;

FIG. 4 shows a tabular illustration of real and imaginary part values in a multiplication of the signal input values according to the approach illustrated in FIG. 5;

FIG. 9 shows a tabular illustration of filter coefficients according to an embodiment of the block illustrated in FIG. 8;

FIG. 12 is a tabular illustration of the word width, data rate and data type of the signals illustrated in FIG. 11A;

FIG. 13 is a tabular illustration of the conversion of an input signal of a block illustrated in FIG. 11A into an output signal of a block using a specified parameter;

FIG. 15 is a tabular representation of word widths, data rates and data types of signals represented in FIG. 14;

FIG. 16 is a tabular illustration of the allocation of signal values to filter coefficients in the time course;

FIG. 17 is a tabular illustration of the allocation of signal values to different polyphases of a polyphase filter;

FIG. 19 is a tabular illustration of the allocation of real or imaginary parts, respectively, of signal values to different polyphases of a polyphase filter;

FIG. 20 is a tabular illustration of an allocation of real and imaginary part values of signal values to polyphases of a polyphase filter;

FIG. 21 is a tabular illustration of the allocation of real and imaginary part values of signal values to individual polyphases of a polyphase filter;

FIG. 22 is a tabular illustration of real and imaginary part values to individual polyphase filters and the result resulting from the polyphase filters;

FIG. 23 is a tabular illustration of a calculation regulation for real and imaginary part values of an output signal of the polyphase filter considering a frequency shift in the positive or negative direction or preventing a frequency shift.

DESCRIPTION OF THE PREFERRED EMBODIMENTS

Figure 1:
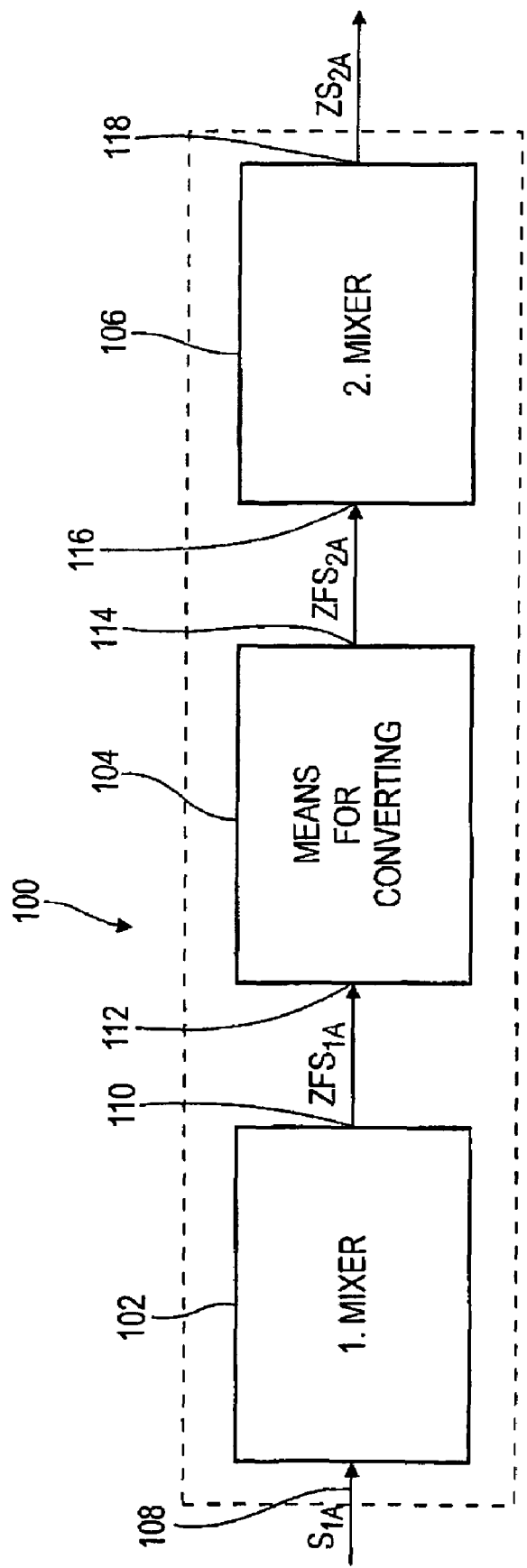
FIG. 1 shows a block diagram of the inventive approach.

In the following description of the preferred embodiments of the present invention, for like elements illustrated in the different drawings, like or similar reference numerals are used, wherein a repeated description of those elements is omitted.

FIG. 1 shows a block diagram of an inventive mixer 100. The mixer 100 includes a first mixer 102, means for converting 104 and a second mixer 106. The first mixer 102 comprises an input 108 for receiving a signal $S_{1A}$ having a current frequency and an output 110 for outputting an intermediate frequency signal $ZFS_{1A}$. Means 104 for converting comprises an input 112 for receiving the intermediate frequency signal $ZFS_{1A}$ having the first sampling frequency output by the first mixer 102. Further, means 104 for converting comprises an output 114 for outputting the intermediate frequency signal $ZFS_{2A}$ having the second sampling frequency, wherein the second mixer 106 comprises an input 116 for receiving the intermediate frequency signal $ZFS_{2A}$ having the second sampling frequency output by means 104 for converting. Further, the second mixer 106 comprises an output 118 for outputting a target frequency signal $ZS_{2A}$ based on the second sampling frequency.

If a signal $S_{1A}$ is supplied to the first mixer 102, the same converts the signal $S_{1A}$ into an intermediate frequency signal $ZFS_{1A}$, wherein only the center frequency of the signal $S_{1A}$ is shifted, the sampling rate of the intermediate frequency signal, however, still corresponds to the sampling rate of the signal $S_{1A}$. This intermediate frequency signal $ZFS_{1A}$ converted to the intermediate frequency is supplied to means 104 for converting generating a converted intermediate frequency signal $ZFS_{2A}$ from the intermediate frequency signal $ZFS_{1A}$. The converted intermediate frequency signal $ZFS_2A$ contains information of the signal $S_{1A}$, wherein the information is arranged in a frequency band comprising a center frequency whose relation to the current frequency was determined by the first mixer 102.

Means 104 for converting performs an adaptation of the sampling rate by transforming the intermediate frequency signal $ZFS_{1A}$ having the first sampling frequency into the converted intermediate frequency signal $ZFS_{2A}$ having the second sampling frequency. Subsequently, the converted intermediate frequency signal $ZFS_{2A}$ is transformed into a target frequency signal $ZS_{2A}$ by the second mixer 106, wherein the second mixer 106 performs a conversion of the information of the converted intermediate frequency signal $ZFS_{2A}$ into the target frequency. Regarding the conversion in the second mixer 106 a sampling rate conversion may be omitted, so that the converted intermediate frequency signal $ZFS_{2A}$ and the target frequency signal $ZS_{2A}$ comprise the same sampling frequency, i.e. the second sampling frequency.

In the following, the principal functioning of the first mixer 102 and the second mixer 106 is described in more detail. First it is assumed that the embodiment illustrated in FIG. 1 of an inventive mixer 100 refers to a mixer in the transmitter, i.e. that, for example, the signal $S_{1A}$ is a baseband signal and the target frequency signal $ZS_{2A}$ is a signal whose center frequency is higher than the center frequency of the signal $S_{1A}$. In particular, this means that the second sampling frequency is higher than the first sampling frequency. In modern mixers such a frequency conversion is usually realized digitally.

A digital mixing of a complex baseband signal, like for example of the signal $S_{1A}$, means, that the baseband signal is multiplied by a rotating complex pointer $e^{j2\pi k f_c/f_s}$, wherein k is a running index of a sample of the complex baseband signal or input signal, $f_c$ is the desired new carrier (i.e. center) frequency and $f_s$ is the sampling frequency. If the special cases $f_c=0$ or $\pm f_s/4$ are selected, then the rotating complex pointer only takes on the values of $\pm 1$ and $\pm j$. When the complex input signal is present in I and Q components, then these multiplications may very easily be achieved by a negation and a multiplexing of the two components, e.g. a multiplication with $-j$ means: $I_{output\ signal}=Q_{input\ signal}$ and $Q_{output\ signal}=-I_{input\ signal}$. With this above-illustrated principle, a mixing onto three frequency sub-bands with the center frequencies $f_c=0$, $f_c=+f_s/4$ and $f_c=-f_s/4$ may be realized.

In order to be able to use such a digital mixing which is simple to realize for an up-conversion, wherein the current frequency is not in an above-described connection with the target frequency, now a cascade-connection of the mixers explained in more detail above may be performed, wherein before a mixing with the second of the cascaded mixers a conversion of the sampling frequency takes place. For such a cascaded mixer, for example in a first mixer stage, as it is illustrated in the mixer illustrated in FIG. 1 by the first mixer 102, the input signal having a first (low) sampling frequency $f_{s1}$ may be brought onto the center frequencies $f_{c1}=0$, $f_{c1}=+f_{s1}/4=+f_1$ or $f_{c1}=-f_{s1}/4=-f_1$ by the first mixer.

Subsequently, for example in means 104 for converting, an upsampling (i.e. a sampling frequency increase), for example by the factor 4 onto a second (higher) sampling frequency $f_{s2}$ takes place. Part of the generation of the $f_{s2}$ samples is here preferably an insertion of "0" values (samples) after each $f_{s1}$ sample (i.e. for this example with $f_{s2}=4*f_{s1}$ an insertion of three "0" values). In the following, a low-pass filtering is performed in order to preserve only the upsampled $f_{s1}$ signal and not its spectral images (i.e. its spectral image frequencies resulting in upsampling) at multiples of the first sampling frequency $f_{s1}$. Subsequently, again a digital mixing may be performed, this time onto the center frequencies $f_{c2}=0$, $f_{c2}=+f_{s2}/4=+f_2$ or $f_{c2}=-f_{s2}/4=-f_2$. Altogether, in thi1s way, based on a signal in the current frequency, nine different center frequencies $f_c$ in relation to the current frequency $f_0$ may be obtained:

$f_c=f_0-f_2-f_1$,
$f_c=f_0-f_2+0$,
$f_c=f_0-f_2+f_1$,
$f_c=f_0-f_1$,
$f_c=f_0$,
$f_c=f_0+f_1$,
$f_c=f_0+f_2-f_1$,
$f_c=f_0+f_2$,
and $f_c=f_0+f_2+f_1$. Such a frequency distribution is illustrated as an example in FIG. 2.

A mixer, like the mixer 100 according to FIG. 1, may now, for example, mix a signal of the current frequency $f_0$ 202, i.e. the center frequency $f_c=f_0$ by a first mixing 204, for example performed in the first mixer 102, to the center frequency $f_c=f_0-f_1$. Subsequently, after an upsampling in means 104 for converting, an increase of the sampling frequency takes place, whereupon for example in the second mixer 106 a mixing 208 of the signal now located in the intermediate frequency with the center frequency $f_c=f_0-f_1$ onto the target frequency 210 with the center frequency $f_c=f_0+f_2-f_1$ may be performed.

Figure 2:
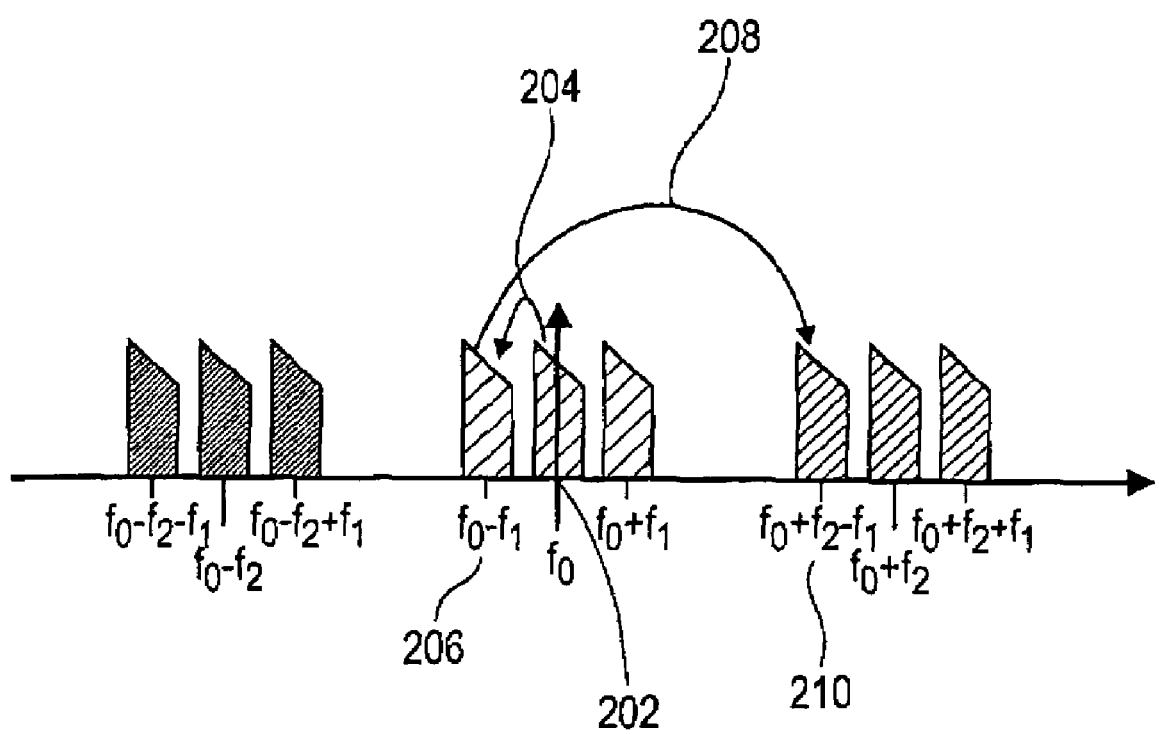
FIG. 2 shows an illustration of the obtainable target frequencies with a mixer implemented according to FIG. 1.

From the illustration according to FIG. 2 it may be seen that also further mixers may be cascade-connected, for example by further means 104 for converting and further mixers, wherein further means 104 for converting and mixers are set up in an analog way to the mixers 104 and 106 in FIG. 1. By this it is possible to shift a signal having a current frequency, for example, to 27 center frequencies, if a three-stage mixer arrangement is realized, or to shift a signal having a current frequency to 81 center frequencies when a four-stage mixer arrangement is realized. Such a cascade may now be continued randomly, wherein a number of obtainable center frequencies is designated by the term $3^x$ and wherein x is the number of cascaded mixers.

Analog to the up-conversion in the transmitter, the down-conversion in the receiver is performed by a rotating complex pointer $e^{j2\pi k f_c/f_s}$. Just like in the transmitter, thus for $f_c=0$ and $\pm f_s/4$ the down-conversion may be achieved by negating and multiplexing of the I and Q components. In this way, likewise three frequency sub-bands may be obtained. Analog to the cascading of mixer stages in the transmitter, again a cascading of mixers may take place, in this case of downconverter stages, whereby the number of frequency bands may be increased which may easily be separated numerically or in circuit engineering. Assuming, for example, the sampling frequency at the receiver input (i. E. the sampling frequency of the signal $S_{1A}$), is equal to $f_{s2}$ and the center frequency of the received signal is $f_c=f_0-f_2-f_1$, $f_c=f_0-f_2+0$,
$f_c=f_0-f_2+f_1$,
$f_c=f_0-f_1$,
$f_c=f_0$,
$f_c=f_0+f_1$,
$f_c=f_0+f_2-f_1$,
$f_c=f_0+f_2$,
and $f_c=f_0+f_2+f_1$. Altogether, nine frequency sub-bands may be separated. All of those center frequencies are mixed by mixing with 0 or $\pm f_{s2}/4=\pm f_2$, respectively, to the center frequencies $f_c=0$ or $f_c=\pm f_{s1}/4=\pm f_1$, respectively.

Subsequently a downsampling from the (higher) sampling frequency $f_{s2}$ to the (lower) sampling frequency $f_{s1}$ takes place, wherein analog to the above-mentioned example the lower sampling frequency is $f_{s1}=f_{s2}/4$. For this purpose, first, preferably the signal present at the high sampling frequency $f_{s2}$ is low-pass filtered in order to mask out the resulting image frequencies in the following downsampling. The following downsampling for this example consists of omitting three of respectively four samples. Then, again a mixing with 0 or $\pm f_{s1}/4=\pm f_1$ may take place, so that finally the signal is at the center frequency $f_0$. For example, the receive signal may be at a center frequency $f_c=f_0+f_2-f_1$, as it illustrated by the center frequency 210 in FIG. 2. By the first mixer, then a mixing which is inverse to the mixing 208 may take place, wherein the signal is then transformed to a center frequency 206 of $f_c=f_0-f_1$. Subsequently, the downsampling takes place. The now downsampled signal at the center frequency 204 of $f_c=f_0-f_1$ may then be converted to the center frequency 202 of $f_c=f_0$ by the second mixer in a mixing which is inverse to the mixing 204.

Analog to the above implementations, also more than nine frequency sub-bands (for example 27, 81 frequency sub-bands) may be received or separated in the above-described way, if a corresponding number of mixer stages are cascaded.

In the following, the mathematical basics of the frequency shift easy to realize in terms of numerics or circuit engineering are to be explained in more detail. In the continuous range, a frequency shift is achieved by the application of the formula $$f(t)*e^{j\omega_0 t}$$

which corresponds to a frequency shift $F(j\omega-\omega_0))$ in the positive direction. The conversion into the discrete time range is as follows:

$$f[n]*e^{jn2\pi f T_s}.$$

In particular, the case of a frequency shift by $f_s/4$ (which corresponds to a rotation by $\pi/2$) is regarded more closely.

If for f $f_s/4$ is substituted in the above formula, wherein $f_s$ is the sampling frequency (i.e. the spectrum is shifted in the "positive" direction), using $f_s=1/T_s$ the following is obtained:

$$f[n]*e^{jn2\pi(1/(4T_s))T_s}=f[n]*e^{jn\pi/2}=y[n].$$

If for an input signal $f[n]=i[n]+j*q[n]$ holds true, then using the Euler formula for the exponential expression (i.e. $e^{jn\pi/2}=\cos(n\pi/2)+j*\sin(n\pi/2)$) terms for the real and imaginary part of y[n] are obtained $$Re\{y[n]\}=i[n]*\cos(n\pi/2)-q[n]*\sin(n\pi/2)$$

$$Im\{y[n]\}=i[n]*\sin(n\pi/2)+q[n]*\cos(n\pi/2).$$

For a frequency shift in the positive direction (i.e. a frequency shift of the input signal toward a higher frequency of the output signal) the argument is positive, while in a frequency shift in the negative direction (i.e. a frequency of an input signal is higher than a frequency of the output signal) the argument of the sine and cosine function is negative. A tabular illustration of the value pairs of the terms $\cos(n\pi/2)$ and $\sin(n\pi/2)$ for different time index values n is illustrated in FIG. 3. Here, the above-mentioned terms for the sine and cosine function are respectively listed for a positive or negative frequency shift, wherein as a time index the values n=0, 1, 2 and 3 are used as a basis.

Based on the table illustrated in FIG. 3 and the above formula, a frequency shift of the input signal f[n] by $f_s/4$ results for a complex input signal $i[n]+j*q[n]$, as it is indicated in the tabular representation in FIG. 4. As it may be seen, the respective values for the real and imaginary parts of the positive and negative shifts for all odd indices are only different regarding their sign. Apart from that it is to be noted, that with all odd time indices the imaginary part value q[n] of the input signal f[n] is allocated to the real part value of the output signal y[n] either directly or in a negated form. Further, for each odd time index the real part value i[n] of an input signal f[n] is allocated to the imaginary part value of an output signal y[n] of the corresponding time index n either directly or in a negated form. The real and imaginary part values of the output signal y[n] of a mixer may thus be regarded as result values of a complex multiplication of an input value f[n] with a complex-value multiplication factor.

Figure 5:
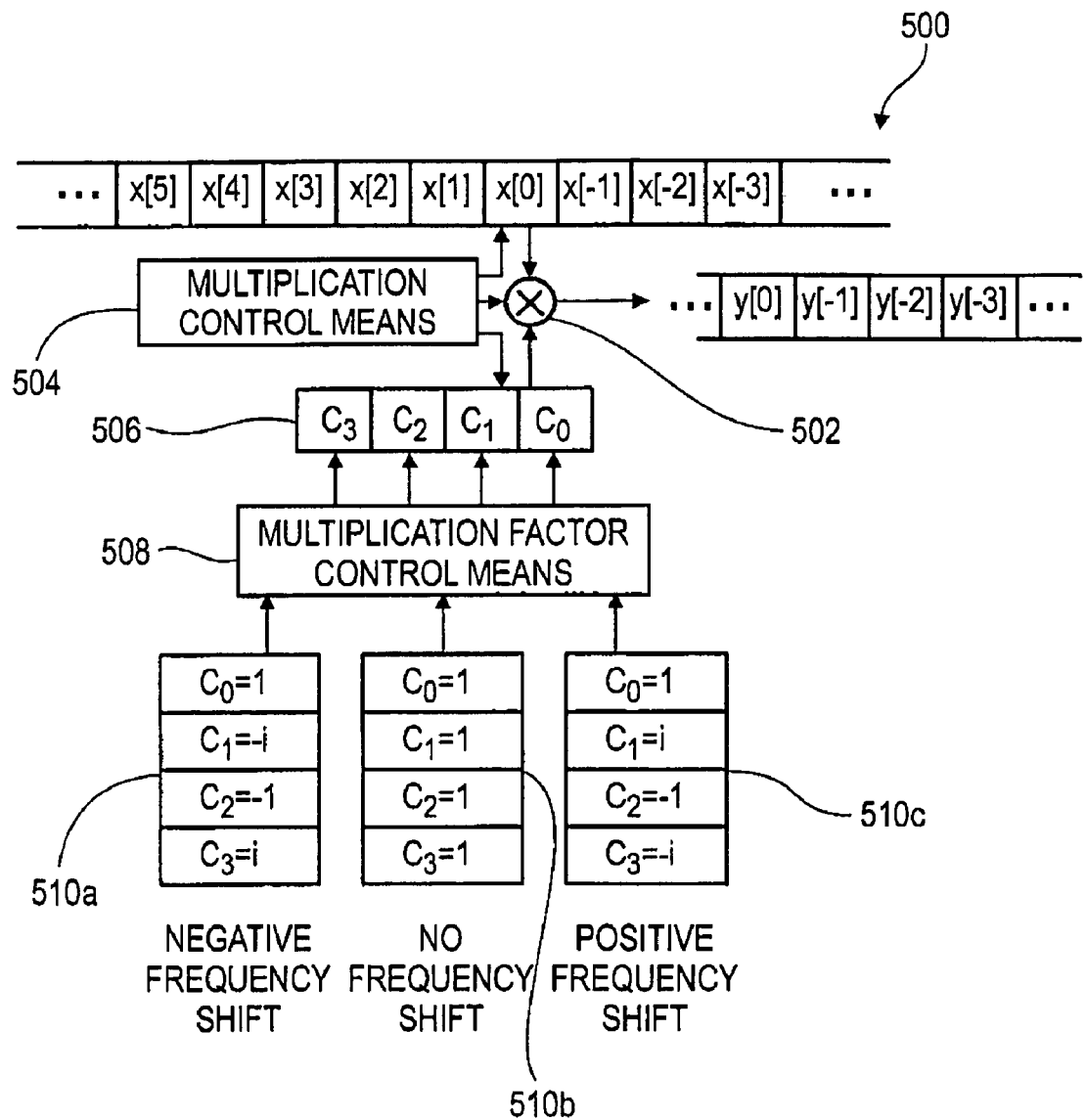
FIG. 5 shows a block diagram of the approach of the multiplication of a signal value with a set of multiplication factors.

Such a multiplication may, for example, be achieved by a multiplication device 500 as it is illustrated in FIG. 5. Such a multiplication device 500 includes a multiplication element 502, a multiplication control means 504, a multiplication factor register 506 with several multiplication factors $c_0$, $c_1$, $c_2$ and $c_3$. A first multiplication factor set 510a (with the coefficients $c_0=1$, $c_1=-i$, $c_2=-1$, $c_3=i$) corresponds to a negative frequency shift, a second multiplication factor set 510b (with the coefficients $c_0=1$, $c_1=1$, $c_2=1$, $c_3=1$) corresponds to a mixing in which no frequency shift takes place, while a third multiplication factor set 510c (with the coefficients $c_0=1$, $c_1=i$, $c_2=-1$, $c_3=-i$) corresponds to a mixing with a positive frequency shift. Further, input signals x[n], wherein n=−3, −2, −1, 0, 1, 2, 3, 4, 5, . . . , may be supplied to the mixer 500. As a result, the mixer 500 may output output values y[n], wherein n=−3, −2, −1, 0, . . . .

The functioning of the mixer 500 illustrated in FIG. 5 may now be described as follows. First, according to a desired frequency shift (for example using a control signal at the control input of the mixer 500 not illustrated in FIG. 5, using which the direction of the frequency shift may be set) one of the multiplication factor sets 510 is loaded into the multiplication factor register 506 for storing the used multiplication factor set with the help of the multiplication factor control means 508. If the mixer 500, for example, is to perform a positive frequency shift by a quarter of the sampling frequency, then the coefficient set 510c is loaded into the register 504. In order now to perform the frequency shift, an input value, for example the value x[0], is loaded into the multiplier 502 and is multiplied in the multiplier with the coefficient $c_0=1$, from which the result y[0] results. In a multiplication with the multiplication factor $c_0=1$ no negation or exchange of the real and imaginary parts of the complex signal input value x[0] results. This is also illustrated in the corresponding line of the table in FIG. 4, in which the real and imaginary parts in a positive frequency shift are shown for the time index 0 and show no change of the real or imaginary part.

As the next element, the subsequent input value x[1] is loaded into the multiplier 502 and multiplied with the multiplication factor $c_1$ (=i). From this, an output signal value results (i.e. a value y[1]), in which the real part of the input value is associated with the imaginary part of the output signal value and the imaginary part of the input value is negated and associated with the real part of the output value, as it is indicated in FIG. 4 in the line corresponding to the time index n=1 for a positive frequency shift.

Analog to this, in the multiplier 502 a multiplication of the next subsequent signal input value x[2] with the multiplication factor $c_2$ (=−1) and the again subsequent signal value x[3] with the multiplication factor $c_3$ (=−i) results. From this correspondingly the values indicated in FIG. 4 for the real and imaginary part of the corresponding output values y[n] result for n=2 and 3 according to the allocation in the column for a positive frequency shift.

The subsequent signal input values may be converted to corresponding signal output values y[n] by a cyclic repetition of the above-described multiplications using the multiplication factor stored in the register 506. In other words, it may thus be said that a positive frequency shift by a quarter of the sampling frequency which the input signal x is based on may be performed by a multiplication by a purely real or a purely imaginary multiplication factor (wherein the purely real and purely imaginary multiplication factors preferably have the same magnitude, for example a magnitude of 1), which again leads to the simplification that the multiplication may be performed merely by the exchange of real and imaginary part values and/or a negation of the corresponding values. Performing the multiplication itself is thus not necessary any more, and the result of the multiplication may rather be determined by those negation or exchange steps.

For a negative frequency shift, the use of the mixer 500 may be performed in an analog way, wherein now the multiplication factor set 510a is to be loaded into the register 506. In an analog way also a mixing may be performed, in which no frequency shift is performed when the multiplication factor set 510b is loaded into the register 506, as here only a signal input value x is multiplied with the neutral element of the multiplication (i.e. with a value 1), whereby the value of the input signal value x to the output signal value y does not change.

Figure 6:
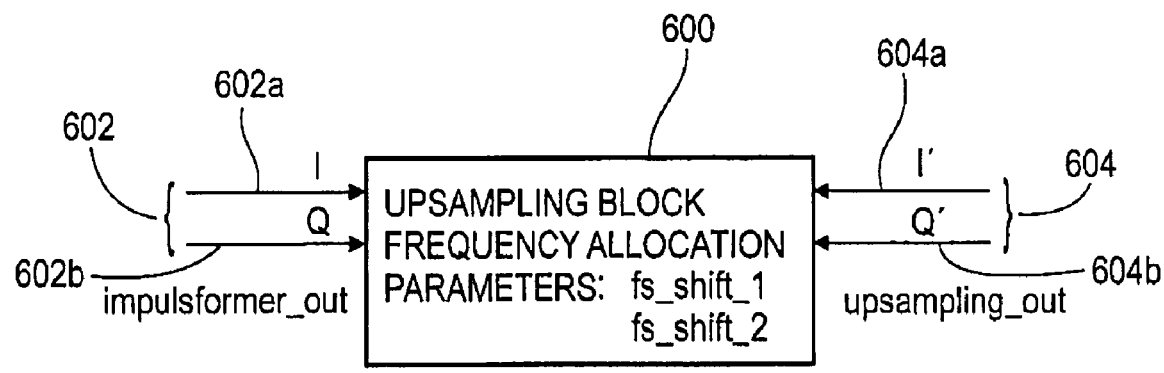
FIG. 6 shows a block diagram of an upsampler which is based on the inventive approach.

In the following, both an upsampling and a frequency allocation is to be explained in more detail, as it is, for example, found in a transmitter. For this purpose, the mixer may be illustrated as an upsampling block 600, as it is shown in FIG. 6. The upsampling block 600 here comprises an input interface 602, via which the upsampling block 600 receives complex input data present in the form of an I component 602a and a Q component 602b. This complex input data is, for example, output by an impulse former (not illustrated), which is why input data or the input data stream, respectively, is also designated in FIG. 6 by the term "impulseformer_out". Further, the upsampling block 600 includes an output interface 604 for outputting the upsampled data, wherein the output interface 604 again includes a first component I' 604a and a second component Q' 604b. As the output data or the output data stream, respectively, is upsampled data, this data stream is also designated by "upsampling_out". In order to enable a frequency allocation, i.e. a frequency shift of the center frequency of the data stream "impulseformer_out" to a center frequency of the data stream "upsampling_out", in the upsampling block 600 the parameters fs_shift_1 and fs_shift_2 are used corresponding to the frequency f1 (=fs_shift_1) and f2 (=fs_shift_2) of FIG. 2.

Regarding the input data stream impulseformer_out it is further to be noted that the same, for example, comprises a word width of 8 bits per I or Q component, a data rate of B_Clock_16 (i.e. one sixteenth of the data rate of the output data stream), wherein the data type of the input data is to be regarded as complex-valued. It is further to be noted regarding the output data stream upsampling_out, that its word width, for example, includes 6 bits per I and Q component. Apart from that, the output data stream upsampling_out comprises a data rate of B_Clock defining the highest data rate or clock frequency, respectively, of the upsampling block 600 regarded here. Apart from that, the data type of the data of the output data stream upsampling_out is to be regarded as a complex data type.

From outside, only the two used frequency parameters fs_shift_1 and fs_shift_2 are transferred to the upsampling block 600. The same determine the conversion of the generated baseband signals (i.e. of the signals contained in the input data stream impulseformer_out) onto an intermediate frequency of [−B_Clock_16, 0, B_Clock_16], at a sampling rate of B_Clock_4 (parameter fs_shift_1) or a conversion to an intermediate frequency of [−B_Clock_4, 0, B_Clock_4] with a sampling rate of B_Clock (parameter fs_shift_2). The sampling rate B_Clock_4 here designates a quarter of the sampling rate or the sampling clock of B_Clock, respectively.

Figure 7:
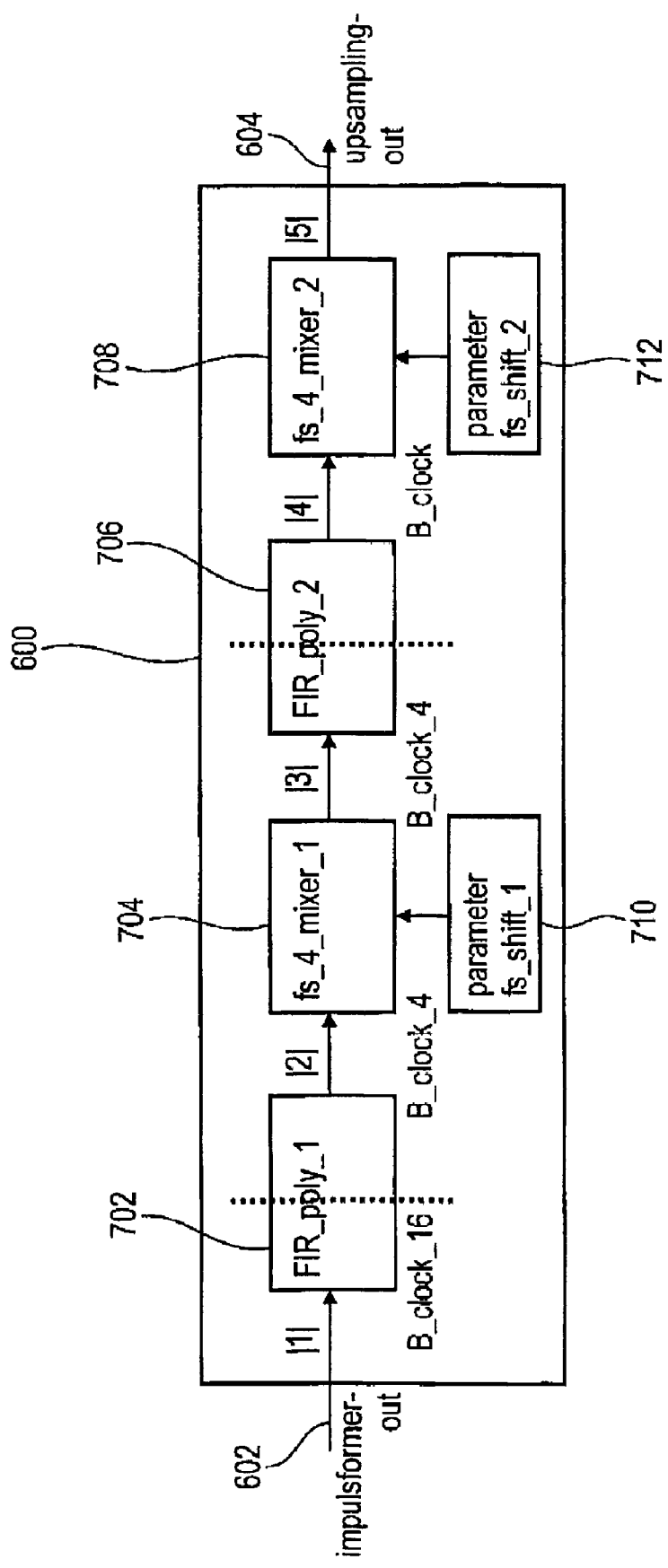
FIG. 7 shows a block diagram representing a detailed illustration of the block shown in FIG. 6.

FIG. 7 shows a detailed block diagram of the upsampling block 600 illustrated in FIG. 6. The upsampling block 600 here corresponds to a mixer 100, as it is illustrated in FIG. 1. The upsampling block 600 may thus also be designated as a mixer. The mixer 600 includes a first polyphase filter 702, a first mixer 704, a second polyphase filter 706, a second mixer 708, a first parameter set 710 and a second parameter set 712. The first polyphase filter 702 includes an input for receiving the input data stream impulseformer_out, equivalently designated by the reference numeral 602 or the reference numeral |1|. The input of the first polyphase filter (which is, for example, implemented as an FIR filter) is thus directly connected to the input 602 of the mixer 600. Further, the first polyphase filter is connected to the first mixer 704 via the port FIR_poly_1_out |2|. Further, the first mixer 704 is connected to an input of the second polyphase filter 706 via the port fs_4_mixer_1_out |3|. The second polyphase filter 706 further comprises an output connected to an input of the second mixer 708 via the port FIR_poly_2_out |4|. further, the second mixer 708 comprises an output connected to the output interface 604 of the mixer 600 via the port upsampling_out |5|. This port thus forms the output of the overall upsampling block 600 and is directly connected into the next higher hierarchy level. Further, the mixer 600 includes the first coefficient set 710 associated with the first mixer 704 and the second coefficient set 712 associated with the second mixer 708. The coefficients fs_shift_1 of the first coefficient set 710 and fs_shift_2 of the second coefficient set 712 are thus only correspondingly passed on to the two blocks fs_4_mixer_1 (i.e. the first mixer 704) or fs_4_mixer_2 (i.e. the second mixer 708), respectively. Further parameters are not contained in this embodiment of the mixer 600.

It is further to be noted that the data stream designated by the reference numeral |1| comprises data with a word width of 8 bits per I and Q component, wherein the data with a data rate of B_Clock_16 (i.e. a sixteenth of the clock B_Clock) are supplied to the first polyphase filter 702. Apart from that, the data supplied to the first polyphase filter comprise a complex-value data type. In the first polyphase filter 702 (which is preferably implemented as an FIR filter) an increase of the sampling clock is performed, for example, from B_Clock_16 to B_Clock_4, which corresponds to a quadruplication of the sampling clock. By this, the signal FIR_poly_1_out designated by the reference numeral |2| distinguishes itself by the fact that the word width is also 8 bits per component and the data type is also to be regarded as complex-valued, and that the data rate was now increased to B_Clock_4, i.e. to a quarter of the maximum clock B_Clock.

In the first mixer 704 using the parameter set 710 for the parameter fs_shift_1 a frequency conversion takes place, wherein a difference between a center frequency of the signal designated by the reference numeral |2| and a center frequency of the signal designated by the reference numeral |3| corresponds to a quarter of the sampling clock rate B_Clock_4. Thus, it may be noted that the signal with the reference numeral |3| was shifted to a higher intermediate frequency than the signal FIR_poly_1_out, wherein a word width of the signal fs_4_mixer_1_out is 8 bits per component, the data type is complex-valued and the data rate is B_Clock_4.

Further, in the second polyphase filter 706 (for example also including an FIR filter) a further upsampling is performed such that the signal FIR_poly_2_out designated by the reference numeral |4| comprises a sampling rate or data rate of B_Clock (i.e. the maximum achievable sampling rate in the mixer 600). The word width of the signal FIR_poly_2_out is here also 8 bits per I and Q component, while the data type of this signal is also complex-valued. Subsequently, by the second mixer 708, which is also a mixer with a frequency shift by a quarter of the supplied sampling frequency, a frequency conversion of the signal FIR_poly_2_out takes place, also designated by the reference numeral |4|, to the signal upsampling_out, also designated by the reference numeral |5|. Here, the parameter set 712 is used, for example, indicating a direction in which the frequency shift is to be performed. The signal upsampling_out may comprise a word width of 6 bits per I and Q component, for example predetermined by an external upsampling filter. The data rate of the signal upsampling_out is B_Clock, while the data type is again complex-valued.

In the following, the basic functioning of block FIR_poly_1 (i.e. of the first polyphase filter 702) and block FIR_poly_2 (i.e. of the second polyphase filter 706) is described in more detail. Each of those blocks, in the present embodiment, causes a quadruplication of the sampling rate with a simultaneous maintenance of the signal bandwidth. In order to upsample a signal by the factor 4, between each input sample three zeros are to be inserted ("zero insertion"). The now resulting "zero-inserted" sequence is sent through a low-pass filter in order to suppress the image spectrums at multiples of the input sampling rate. According to principle, here all used filters are real, i.e. comprise real-valued coefficients. The complex data to be filtered may thus always be sent through two parallel equal filters, in particular a division of a signal into an I component (i.e. a real part of the signal) and a Q component (i.e. an imaginary part of the signal), respectively only comprising real values, is in this case clearly simplified, as a multiplication of real-value input signals with real-value filter coefficients is numerically substantially more simple than multiplications of complex-valued input values with complex-valued filter coefficients.

Some known characteristics of the input signal or the spectrum to be filtered, respectively, may be used to further minimize the computational overhead. In particular, by a polyphase implementation and a use of the symmetry of sub-filters of the polyphase implementation, advantages may be used, as it is explained in more detail below.

A polyphase implementation may preferably be used, as the input sequence only comprises a value different from 0 at every fourth digit, as described above. If an FIR filter in a "tapped delay line" structure is assumed, then for the calculation of each output value only L/R coefficients are used (L=FIR filter length, R=upsampling factor). The used coefficients repeat periodically after exactly R output values. Thus, such an FIR filter may be divided into R sub-filters of the length L/R. The outputs of the corresponding filters then only have to be multiplexed in the correct order to a higher-rate data stream. Further, it is to be noted that a realization of the FIR filter, for example with the function "intfilt" of the software tool MATLAB, leads to a regular coefficient structure for the second sub-filter (i.e. the second sub-filter comprises an even length and an axial symmetry). Further it may be seen that the fourth sub-filter may approximately be reduced to one single delay element, as it is indicated in more detail below.

Figure 8:
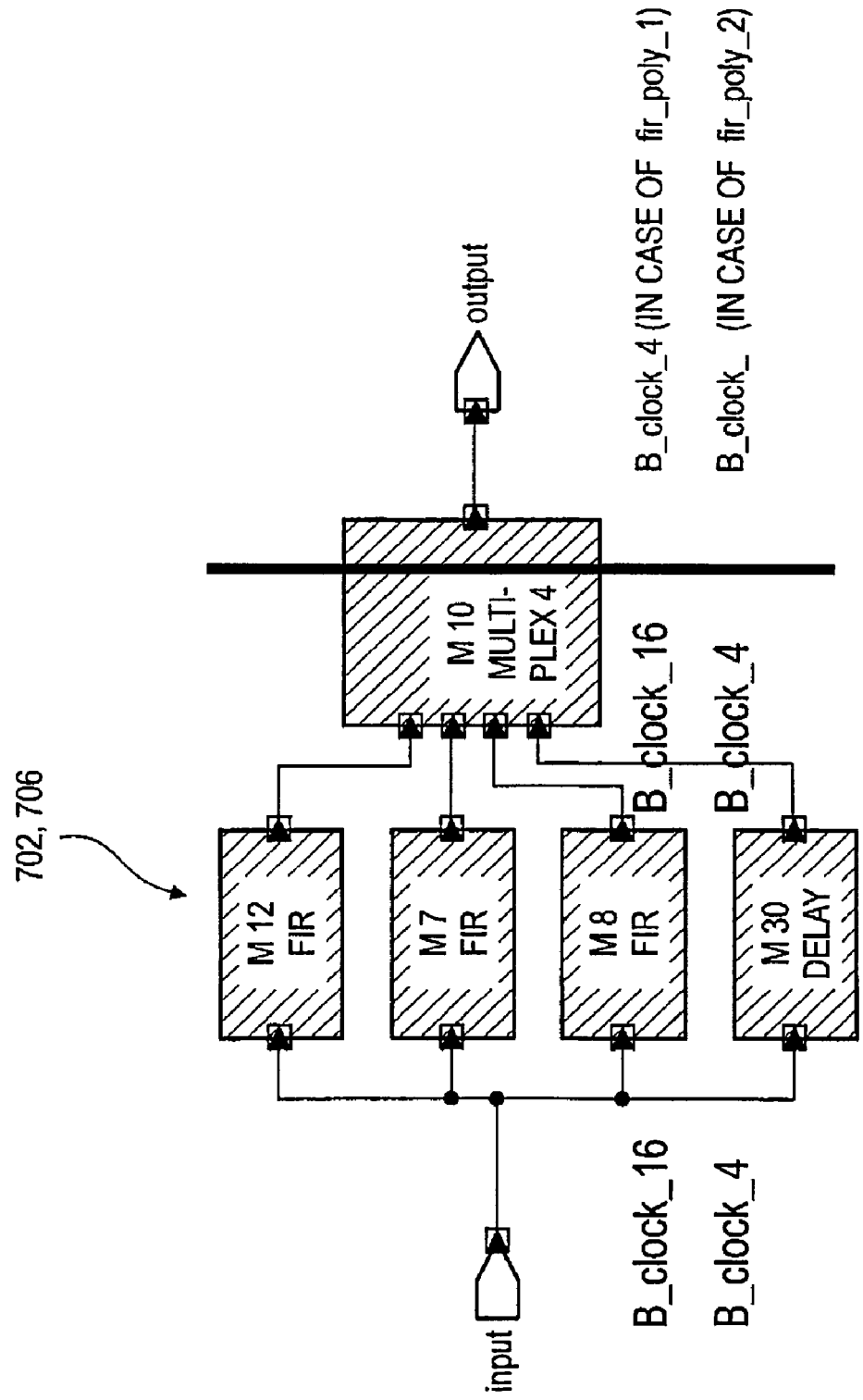
FIG. 8 shows a block diagram representing a detailed illustration of the block illustrated in FIG. 7.

A block diagram of a concrete realization of a polyphase filter, like, for example, of the first polyphase filter 702 or of the second polyphase filter 706 is indicated as an example in FIG. 8. Such a polyphase filter includes an input, a first FIR filter M12, a second FIR filter M7, a third FIR filter M8, a delay element M30, a four-to-one multiplexer M10 and an output. The first FIR filter M12, the second FIR filter M7, the third FIR filter M8 and the delay element M30 respectively comprise an input and an output, wherein the input of each of the four mentioned elements is connected to the input of the polyphase filter. The four-to-one multiplexer M10 comprises four inputs and one output, wherein each of the four inputs is connected to one output of one of the FIR filters M12, M7, M8 or the output of the delay element M30. Further, the output of the four-to-one multiplexer M10 is connected to the output of the polyphase filter. An input data stream which is fed to the polyphase filter 702 or 706, respectively, via the input of the same, is thus put in parallel onto four FIR filters (i.e. after the reduction of the sub-filter 4 to one delay element only to the three FIR filters M12, M7 and M8) and is then again multiplexed by the four-to-one multiplexer M10. By this parallelization, a change of the port rates between the input of the polyphase filter and the output of the polyphase filter by the factor of 4 is achieved.

In a use of the structure illustrated in FIG. 8 for the first polyphase filter, i.e. the polyphase filter FIR_poly_1 illustrated in FIG. 7, this means an increase of the data rate from B_Clock_16 to B_Clock_4. For the case of using the figure illustrated in FIG. 8 for the second polyphase filter 706, i.e. the filter FIR_poly_2 illustrated in FIG. 7, this means a data rate increase from B_Clock_4 to B_Clock. It may further be noted that such a filter, in particular the filter coefficients, may for example be generated using the command coeff=intfilt (4, 6, ⅔) of the software tool MATLAB.

FIG. 9 shows a tabular representation of filter coefficients $a_0$ to $a_{46}$, as it may be obtained using the above-mentioned command with the software tool MATLAB. To the individual sub-filters, i.e. the first FIR filter M12, the second FIR filter M7, the third FIR filter M8 and the delay element, now different coefficients of the coefficient set of the filter coefficients $a_0$ to $a_{46}$ illustrated in FIG. 9 may be allocated. For example, the coefficients $a_0$, $a_4$, $a_8$, $a_{12}$, . . . may be allocated to the first FIR filter M12. This may again be performed using a MATLAB command coeff1=coeff(1:4:end). The coefficients $a_1$, $a_5$, $a_9$, $a_{13}$, . . . may be allocated to the second FIR filter M7, as it is, for example, possible using the MATLAB command coeff2=coeff(2:4:end). The coefficients $a_2$, $a_6$, $a_{10}$, $1_{14}$, . . . may be allocated to the third FIR filter M8, as it is, for example, possible using the MATLAB command coeff3=coeff(3:4:end). The coefficients $a_3$, $a_7$, $a_{11}$, $a_{15}$, . . . may be allocated to the fourth FIR filter (which may, for the reasons described below, be reduced to a delay element), as it is, for example, possible using the MATLAB command coeff4=coeff(4:4:end).

As it may be seen from the tabular illustration in FIG. 9, the coefficients allocated to the fourth sub-filter approximately comprise the value 0, except for the coefficient $a_{23}$, approximately comprising the value of 1. For this reason, neglecting the coefficients approximately having the value 0, the fourth sub-filter may be changed to a delay structure, as the coefficient set of the fourth sub-filter coeff4 is occupied by a value of approximately 1 (see $a_{23}$) only at digit 6 (sixth element of the coefficient set in the MATLAB count). Thus, this block may be replaced by a delay element with delay=5, which corresponds to a shift of the input value by five elements. Further, the coefficient set coeff2, associated with the second sub-filter M7, comprises an axial-symmetrical structure and an even length, whereby this FIR filter may be shortened in order to at least halve the number of multiplications.

In the following, the setup of the first mixer 704 and of the second mixer 706 are described in more detail, corresponding to the blocks fs_4_mixer_1 and fs_4_mixer_2 illustrated in FIG. 7. In principle it may be noted that a mixer converts a signal up or down in the spectral range by a certain frequency. The shift is here always related to the sampling frequency. An $f_s/4$ mixer, for example, shifts an input signal by exactly 25% of the sampling frequency and outputs this signal shifted in the frequency range as an output signal. A complex mixing, i.e. a mixing of a complex signal, is performed by a multiplication with a complex rotary term, which is:

$$dt[n]=\exp[i*2*\pi*\Delta f/f_s*n) \text{ wherein } i=sqrt(-1).$$

With a frequency shift of $\Delta f=f_s/4$, such an $f_s/4$ mixer is reduced to a simple multiplier using the vector [1; i; −1; −i]. This was already illustrated as an example in FIG. 5. It may thus be said that the first, fifth, ninth, ... input value is always multiplied by 1, while the second, sixth, tenth, ... input value is always multiplied by i. The third, seventh, eleventh, ... input value is then always multiplied by −1 and the fourth, eighth, twelfth, ... input value is always multiplied by −i. Such a multiplication results in a positive frequency shift.

Figure 10:
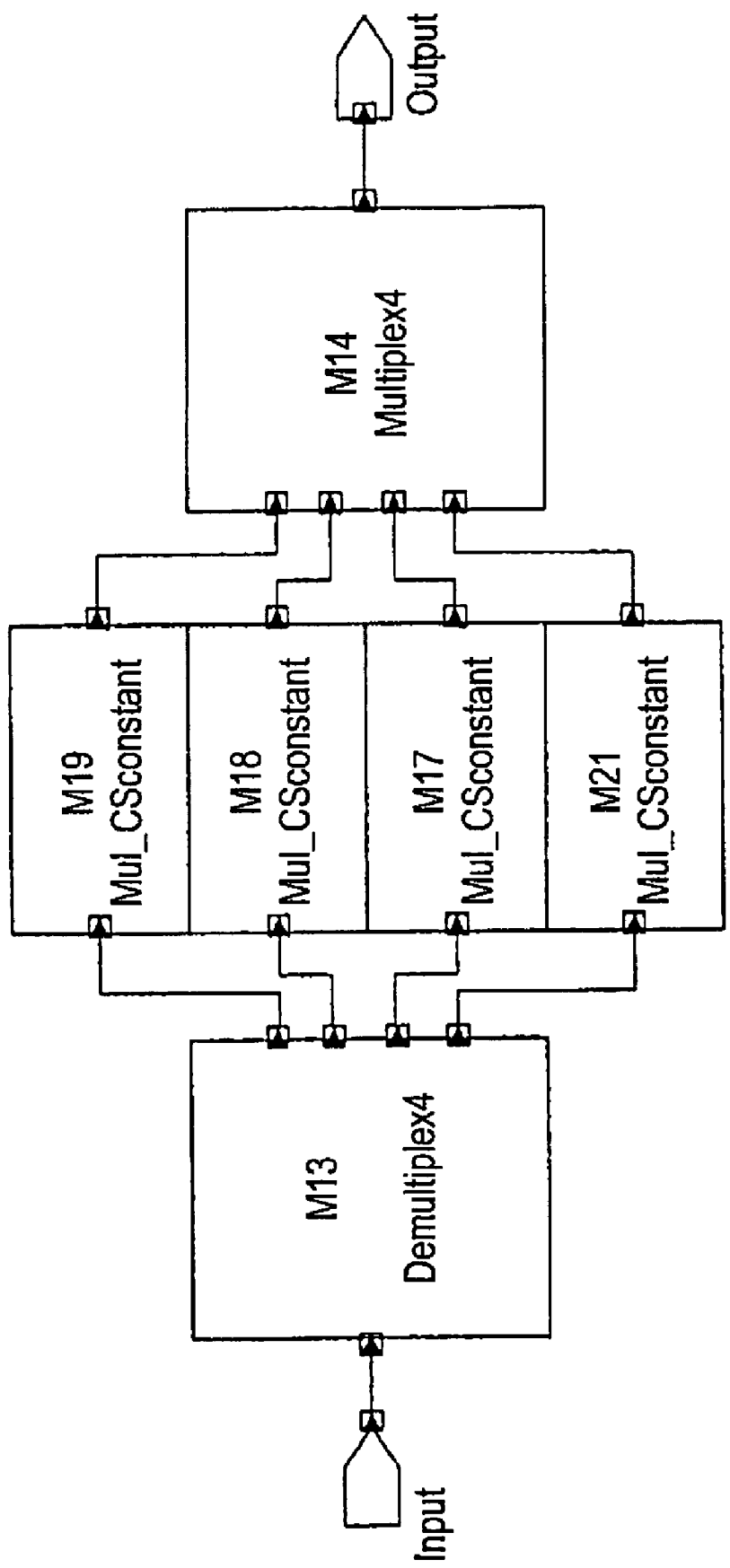
FIG. 10 shows a block diagram representing a detailed illustration of a block of FIG. 7.

As it was indicated above, such an $f_s/4$ mixing may be realized by four simple operations. Similar to a polyphase filter, such a mixer block, as it is illustrated in FIG. 7 as a first mixer 704 and a second mixer 708, may internally operate at a quarter of the output data rate. A mixer implemented in such a way is illustrated in FIG. 10. Such a mixer thus includes a mixer input, indicated as input, a one-to-four demultiplexer M13, a first multiplication element M19, a second multiplication element M18, a third multiplication element M17, a fourth multiplication element M21, a four-to-one multiplexer M14 and an output designated by output in FIG. 10.

The one-to-four demultiplexer M13 includes an input connected to input. Further, the one-to-four demultiplexer includes four outputs. The multiplication elements M19, M18, M17 and M21 respectively include one input and one output. One input each of one of the multiplication elements is connected to another output of the one-to-four demultiplexer M13. The four-to-one multiplexer M14 includes four inputs, wherein respectively one of the inputs of the four-to-one multiplexer M14 is connected to another output of one of the multiplication elements. Further the output of the four-to-one multiplexer M14 is connected to output.

If such a mixer illustrated in FIG. 10 receives a signal at its input, this signal is divided into block of four continuous signal values each, wherein one signal value each is allocated to another one of the multiplication elements M19, M18, M17 and M21. In those multiplication elements a multiplication explained in more detailed below takes place, wherein the result of the multiplication is supplied to the four-to-one multiplexer M14 via the outputs of the multiplication elements, generating a serial data stream from the supplied values and outputting the same via the output.

The values supplied to the mixer via its input are preferably complex data values, wherein to each of the multiplication elements M19, M18, M17 and M21 a complex data value is supplied through the one-to-four demultiplexer M13. For the multiplication, in each of the multiplication elements, subsequently a multiplication with a multiplication factor is performed, wherein the multiplication factor, for example, corresponds to the above-mentioned vector [1; i; −1; −i]. If, for example, in the first multiplication element M19 a multiplication with the first coefficient of the above-mentioned vector is performed (i.e. with a coefficient of 1) this means that directly at the output of the first multiplication element M19 the value applied at the input of the first multiplication element is output. If, for example, at the second multiplication element M18 a multiplication with the second coefficient (i.e. with i) is performed, this means that at the output of the second multiplication element M18 a value is applied corresponding to the following context:

$$\text{output}=-\text{imag (input)}+1*\text{real (input)},$$

wherein imag (input) designates the imaginary part of the input value and real (input) designates the real part of the input value.

If, for example, in the third multiplication element a multiplication with the third coefficient of the above-mentioned vector (i.e. with −1) is performed, this means that at the output of the third multiplication element M17 a value is applied which assumes the following context with regard to the value applied to the input:

$$\text{output}=-\text{real (input)}-i*\text{imag (input)}.$$

If further in the fourth multiplication element M21 a multiplication using the fourth coefficient (i.e. using −1) as a multiplication factor is performed, this means that at the output of the fourth multiplication element M21 a value is output which, considering the value applied at the input of the fourth multiplication element, is in the following context:

$$\text{output}=\text{imag (input)}-i*\text{real (input)}.$$

Depending on the default of the parameter value fs_shift_1 illustrated in FIG. 7, which is supplied to the first mixer, or the second parameter set 712 with the parameter value fs_shift_2 which is supplied to the second mixer 708, a special vector is selected indicating the individual constants. For the case that, for example, fs_shift_x (with x=1 or 2) is selected to be −1, i.e. that a negative frequency shift is to be performed, a vector is to be selected comprising the following coefficient sequence: [1, −i, −1, i].

For the case that the parameter fs_shift_x is selected to be 0, i.e. that no frequency shift is to take place in the mixer, a coefficient vector with a coefficient sequence of [1, 1, 1, 1] is to be selected, while for the case that the parameter fs_shift_x is selected to be 1 (i.e. that a positive frequency shift is to take place), a vector with a coefficient sequence of [1, i, −1, −i] is to be selected. From the above explanations it results that the first parameter set 710 and the second parameter set 712 may be selected different from each other, depending on which of the different target frequencies is to be achieved.

Figure 11A:
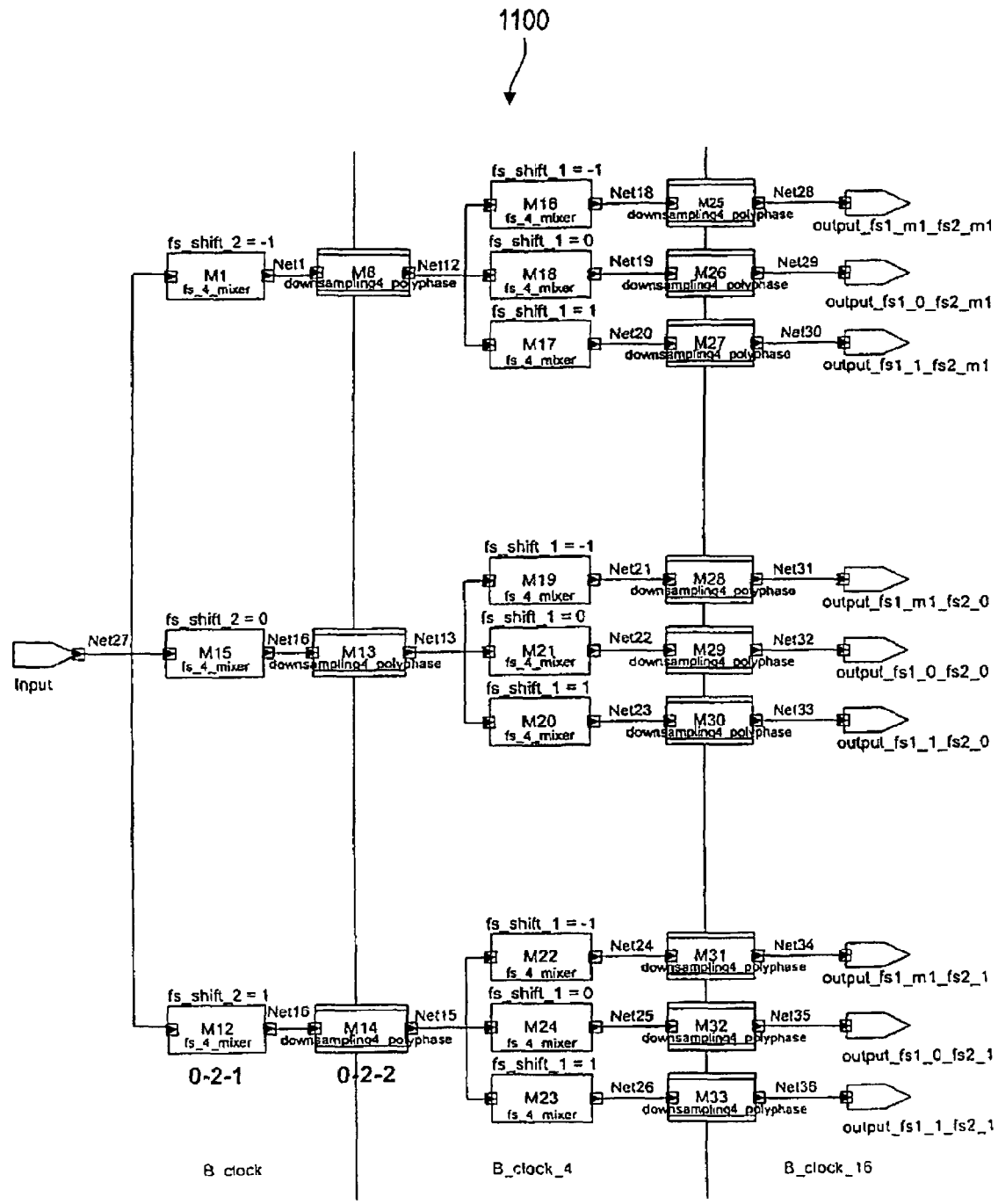
FIG. 11A shows a block diagram representing an embodiment of a mixer when using the mixer as a down-mixer (down-mixer)

In the following, the downsampling is explained in more detail as it takes place, for example, in the frequency conversion in the receiver from a high current frequency to a low target frequency. Regarding this, FIG. 11A shows a block diagram of a mixer stage, as it may, for example, be used in a receiver. The mixer stage 1100 includes an input, a first mixer M1, a second mixer M15 and a third mixer M12, which are arranged in parallel in a first mixer level 0-2-1. Further, the mixer 1100 includes a first downsampling polyphase filter M8, a second downsampling polyphase filter M13, a third downsampling polyphase filter M14, a fourth mixer M16, a fifth mixer M18, a sixth mixer M17, a seventh mixer M19, an eighth mixer M21, a ninth mixer M20, a tenth mixer M22, an eleventh mixer M24 and a twelfth mixer M23. Additionally, the mixer 1100 further includes a fourth downsampling polyphase filter M25, a fifth downsampling polyphase filter M26, a sixth downsampling polyphase filter M27, a seventh downsampling polyphase filter M28, an eighth downsampling polyphase filter M29, a ninth downsampling polyphase filter M30, a tenth downsampling polyphase filter M31, an eleventh downsampling polyphase filter M32 and a twelfth downsampling polyphase filter M33.

Further, the mixer 1100 includes a first output output_fs1_m1_fs2_m1, a second output output_fs1_0_fs2_m1, a third output output_fs1_1_fs2_m1, a fourth output output_fs1_m1_fs2_0, a fifth output output_fs1_0_fs2_0, a sixth output output_fs1_1_fs2_0, a seventh output output_fs1_m1_fs2_1, an eighth output output_fs1_0_fs2_1, a ninth output output_fs1_1_fs2_1.

All components of the described mixer 1100 (except for the input and the outputs output_. . . ) respectively include one input and one output. The input of the first mixer M1, the second mixer M15 and the third mixer M12 are connected to the input of the mixer 1100 via the signal Net27. The output of the first mixer M1 is connected to the input of the first downsampling polyphase filter M8 via the signal Net1. The output of the first polyphase filter M8 is connected to the inputs of the fourth mixer M16, the fifth mixer M18 and the sixth mixer M17 via the signal Net12. The output of the fourth mixer M16 is connected to the input of the fourth downsampling polyphase filter M25 via the signal Net18, while the output of the fourth downsampling polyphase filter M25 is connected to the first output of the mixer 1100 via the signal Net28. The output of the fifth mixer M18 is connected to the input of the fifth downsampling polyphase filter M26 via the signal Net19, while the output of the fifth downsampling polyphase filter M26 is connected to the second output of the mixer 1100 via the signal Net29. The output of the sixth mixer M17 is connected to the input of the sixth downsampling polyphase filter M27 via the signal Net20, while the output of the sixth downsampling polyphase filter M27 is connected to the third output of the mixer 1100 via the signal Net30.

The output of the second mixer is connected to the input of the second downsampling polyphase filter M13 via the signal Net16. The output of the second downsampling polyphase filter M13 is connected to the inputs of the seventh mixer M19, the eighth mixer M21 and the ninth mixer M20 via the signal Net13. The output of the seventh mixer M19 is connected to the input of the seventh downsampling polyphase filter M28 via the signal Net21, while the output of the seventh downsampling polyphase filter M28 is connected to the fourth output via the signal Net31. The output of the eighth mixer M21 is connected to the input of the eighth downsampling polyphase filter M29 via the signal Net22, while the output of the eighth downsampling polyphase filter M29 is connected to the fifth output via the signal Net32. The output of the ninth mixer M20 is connected to the input of the ninth downsampling polyphase filter M30 via the signal Net23, while the output of the ninth downsampling polyphase filter M30 is connected to the sixth output via the signal Net33.

The third mixer M12 is connected to the input of the third downsampling polyphase filter M14 via the signal Net16. The output of the third downsampling polyphase filter M14 is connected to the inputs of the tenth mixer M22, the eleventh mixer M24 and the twelfth mixer M23 via the signal Net15. The output of the tenth mixer M22 is connected to the tenth downsampling polyphase filter M31 via the signal Net24, while the output of the tenth downsampling polyphase filter M31 is connected to the seventh output via the signal Net34. The output of the eleventh mixer M24 is connected to the input of the eleventh downsampling polyphase filter M32 via the signal Net25, while the output of the eleventh downsampling polyphase filter M32 is connected to the eighth output via the signal Net35. The output of the twelfth mixer M23 is connected to the input of the twelfth downsampling polyphase filter M33 via the signal Net26, while the output of the twelfth downsampling polyphase filter M33 is connected to the ninth output via the signal Net36.

Further, the outputs of the mixer 1100 are connected to the following components:

output_fs1_m1_fs2_m1 to the output of the fourth downsampling polyphase filter M25 output_fs1_0_fs2_m1 to the output of the fifth downsampling polyphase filter M26 output_fs1_1_fs2_m1 to the output of the sixth downsampling polyphase filter M27 output_fs1 m1_fs2_0 to the output of the seventh downsampling polyphase filter M28 output_fs1_0_fs2_0 to the output of the eighth downsampling polyphase filter M29 output_fs1_1_fs2_0 to the output of the ninth downsampling polyphase filter M30 output_fs1_m1_fs2_1 to the output of the tenth downsampling polyphase filter M31 output_fs1_0_fs2_1 to the output of the eleventh downsampling polyphase filter M32 output_fs1_1_fs2_1 to the output of the twelfth downsampling polyphase filter M33.

Analog to the mixer illustrated in FIG. 7, in the mixer 1100 illustrated in FIG. 11A also three different clock frequencies are used. First, the signal received at the input is based on a sampling frequency of B_Clock, wherein the first mixer M1, the second mixer M15 and the third mixer M12 operate using the sampling frequency B_Clock. In the following, in level 0-2-2, i.e. through the first downsampling polyphase filter M8, the second downsampling polyphase filter M13 and the third downsampling polyphase filter M14 a sampling rate reduction to a new sampling rate of B_Clock_4 takes place, which corresponds to a quarter of the sampling rate B_Clock. This means that the fourth to twelfth mixer operates with a sampling rate of B_Clock_4. In the following, by the fourth to twelfth downsampling polyphase filter a further sampling rate reduction to a new sampling rate of B_Clock_16 is performed, i.e. again a quartering of the sampling rate used in the fourth to twelfth mixer, which corresponds to one sixteenth of the sampling frequency of the signal applied to the input.

By the mixer structure 1100 illustrated in FIG. 11A, thus from the signal received at the input of the mixer 1100 simultaneously nine frequency sub-bands may be extracted. To this end it is necessary that the three mixers of level 0-2-1 are respectively set to a different mixing performance, that, for example, the first mixer M1 is set to a downconversion (downward mixing), the second mixer M15 to a neutral frequency conversion (i.e. no frequency shift) and the third mixer M12 to an upconversion (upward mixing). Further, also those mixer operating with the sampling rate B_Clock_4 (i.e. in particular the fourth to twelfth mixer) should be grouped into three mixers, respectively, wherein each mixer group is respectively connected downstream to one of the downsampling polyphase filters of the structure level 0-2-2. Each of the three mixers of a mixer group (i.e. for example the fourth, fifth and sixth mixers) should again be set different from each other so that, for example, the fourth mixer may again perform a downconversion, the fifth mixer no frequency conversion and the sixth mixer an upconversion. For the group of the seventh to ninth mixer and the group of the tenth to twelfth mixer the same holds true.

By such a cascaded and also parallel-connected mixer arrangement, thus the nine frequency bands may be extracted simultaneously from the signal applied at the input of the mixer 1100, as it is, for example, illustrated in FIG. 2. An advantage of such a parallel and cascaded arrangement is in particular that, on the one hand, by a structure easy to be implemented regarding numerics or circuit engineering a plurality of frequency sub-bands may simultaneously be resolved or received, respectively.

Figure 11B:
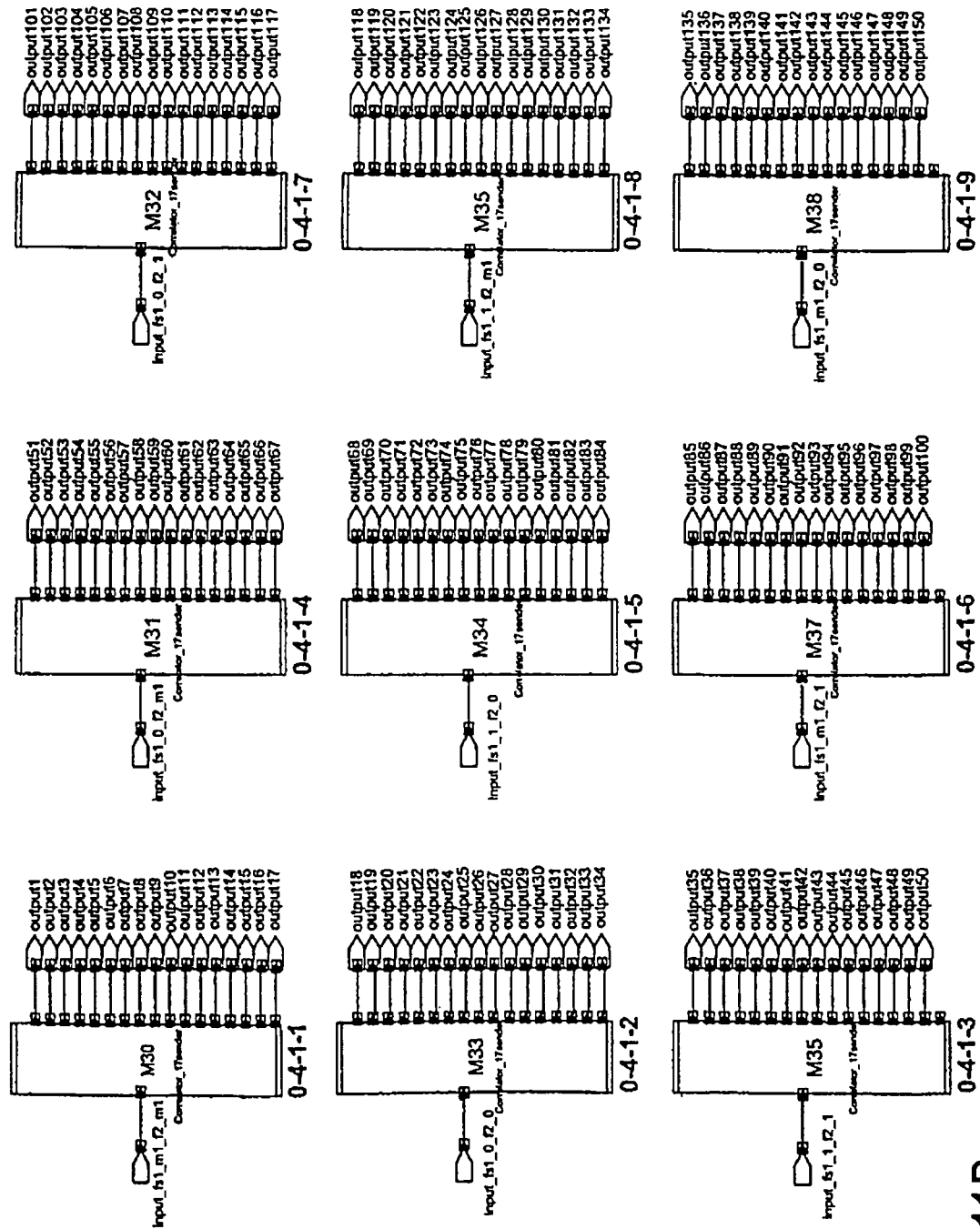
FIG. 11B shows a block diagram of a possible use of the outputs of the mixer shown in FIG. 11A using several correlators.

If now the individual frequency sub-bands, as they are illustrated in FIG. 11A as output signals, are to be provided with data, then on the individual frequency bands also several signals of different bands may be transmitted if the same are suitably correlated with each other. Here, FIG. 11B shows 9 correlators 0-4-1-1 to 0-4-1-9, representing the corresponding output signals of the mixer 1100 illustrated in FIG. 11A. Here, the corresponding output signals output_fs1_m1_fs2_m1 to output_fs1_1_fs2_1 are to be regarded as input signals input_fs1_m1_fs2_m1 to input_fs1_m1_fs_0. Each of the correlators 0-4-1-1 to 0-4-1-9 has one input and 17 outputs, wherein each of the outputs outputs an output signal output1 to output150 which is different from the other output signals. By such a setup, for example, 150 reference sequences may be distributed by 150 transmitters to the nine available frequency bands. A distribution of the individual reference sequences of the transmitters on one frequency band may in this case be performed by a correlation, wherein the obtained 150 correlation signals may later be used, for example, to coarsely determine the positions of 150 tracking bursts.

If only one frequency band existed, in which the 150 transmitters are located, 150 different reference sequences would be required for a possibility of distinguishing the individual transmitters. As the transmitters are distributed to 9 different frequency bands, theoretically only ⌈150/9⌉=17 sequences would be required, wherein 6 frequency bands respectively include 17 transmitters and 3 frequency bands (occupied by the correlators 0-4-1-3, 0-4-1-6 and 0-4-1-9) only respectively include 16 transmitters.

Assuming that the frequency bands have the same reference sequences for their 17 or 16 transmitters, respectively, in a simulation of such a transmission scenario the following problem occurs:

Two acquisition bursts were sent without mutually overlapping and without noise, wherein the two acquisition bursts were located in two different frequency bands but had the same reference sequences. With a particular selection of the two frequency bands, in the correlation with a sequence erroneously also peaks of the second burst sent were detected. These are exactly those frequency bands wherein one of the two rotation parameters fs shift_1 or fs_shift_2 matches, as in those cases the image spectrum of a frequency band is not sufficiently suppressed in the areas of the other associated frequency bands.

Figure 11C:
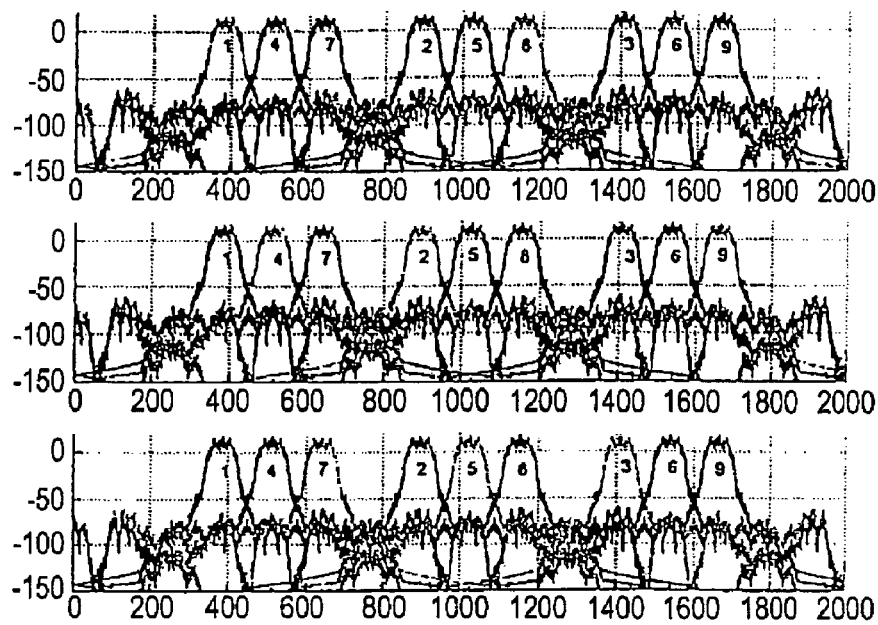
FIG. 11C shows a diagram of a possible occupation of frequencies in the use of the correlators illustrated in FIG. 11B.
Figure 11D:
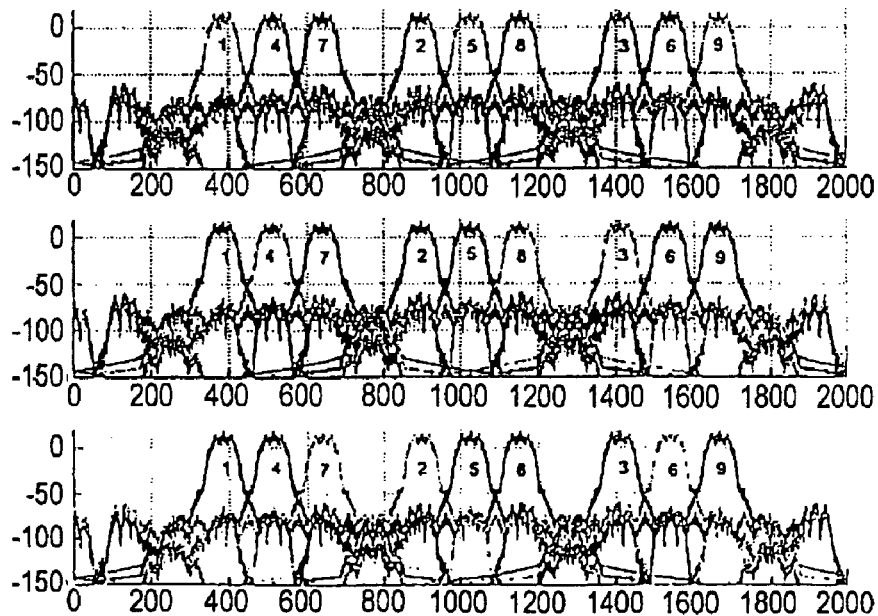
FIG. 11D shows a further diagram of a possible occupation of frequencies in the use of the correlators illustrated in FIG. 11B.

There are two possibilities to respectively merge three frequency bands having no common rotation parameter and for which thus the same sequences may be used without a false detection occurring (see FIG. 11C and FIG. 11D).

I.e., instead of 17 sequences 150/3=50 sequences are required.

The same sequences may be given to the following sequence triples:

1 (fs_shift_1=−1, fs_shift_2=−1), 6 (fs_shift_1=0, fs_shift_2=1), 8 (fs_shift_1=1, fs_shift_2=0) (see FIG. 11C topmost sub-diagram) or 2 (fs_shift_1=−1, fs_shift_2=0), 4 (fs_shift_1=fs_shift_1=0, fs_shift_2=−1), 9 (fs_shift_1=1, fs_shift_2=1) (see FIG. 11C middle sub-diagram) or 3 (fs_shift_1=−1, fs_shift_2=1), 5 (fs_shift_1=0, fs_shift_2=0), 7 (fs_shift 1=−1, fs_shift 2=−1) (see FIG. 11C bottommost sub-diagram) or alternatively the same sequences may be given to the following frequency triples:

1(fs_shift 1=−1, fs_shift_2=−1), 5 (fs_shift 1=0, fs_shift_2=0), 9 fs_shift_1=1, fs_shift 2=1) (see FIG. 11D topmost sub-diagram) or 3(fs_shift_1=−1, fs_shift_2=1), 4 (fs_shift_1=0, fs_shift_2=−1), 8 (fs_shift_1=1, fs_shift_2=0) (see FIG. 11D middle sub-diagram) or 2(fs_shift_1=−1, fs_shift_2=0), 6 (fs_shift_1 0, fs_shift_2=1), 7 (fs_shift_1=−1, fs_shift_2=−1) (see FIG. 11D bottommost sub-diagram).

The two FIGS. 11C and 11D this way show two possibilities to respectively occupy three frequencies with the same sequences. In the correlators of FIG. 11B the second possibility was selected, so that the same correlation sequences are used in blocks 0-4-1-1 to 0-4-1-3 or in blocks 0-4-1-4 to 0-4-1-6, or in the blocks 0-4-1-7 to 0-4-1-9, respectively. With the exception of the input signals in the different correlation sequences, the setup of blocks 0-4-1-1 to 0-4-1-9 is identical. As the correlation is performed after the matched filter, the correlation sequences in the binary case only have the coefficients of 1 and −1. For the quaternary case, the coefficients are 1+j, −1+j, 1−j and −1−j. In both cases, the correlation sequences thus have to be in the sampling clock B_clock_48.

FIG. 12 shows a tabular illustration of the word width, data rate and data type of the signals illustrated in FIG. 11A, wherein it is to be noted that the word width of the corresponding signals may be defined depending on the used hardware components (tbd=to be defined). For the signal values of all signals, a complex data type is assumed.

First, a signal received from the mixer 1100 with a sampling clock B_clock is correspondingly down-converted by a quarter of the sampling frequency $f_s$, is not frequency converted, or is up-converted by a quarter of the sampling frequency $f_s$, using the parameter fs_shift_2 (i.e. with the parameter values fs_shift_2=−1, 0, 1), whereby three different signals are obtained. A more accurate definition of the parameter fs_shift_2 was discussed above. From the signal Net1 thus, as shown in the block diagram of FIG. 11A, the input signal Net27 is mixed with fs_shift_2=−1, the signal Net17 is mixed with fs_shift_2=0 and the signal Net16 is mixed with fs_shift_2=1. Those three signals are then low-pass-filtered separately and downsampled, whereby three signals having a sample clock B_clock_4 are obtained.

Subsequently, those signals are each frequency-converted again using the parameter fs_shift_1 (i.e. the parameter values fs_shift 1=−1, 0, 1), wherein now the offset of the converted frequency corresponds to a quarter of the new sampling frequency (in the positive and negative direction) or is equal to 0. The input signals Net12, Net13 and Net15 are here mixed according to the table in FIG. 13 with the parameter fs_shift_1 in order to obtain the output signals Net18, Net19, Net20, Net21, Net22, Net23, Net24, Net25 and Net26. Finally, the nine resulting signals are low-pass filtered and downsampled and thus fed out at a sample clock of B_clock_16 via the first to ninth output.

In the following, again briefly the functioning of the mixers is explained, taking the mixers in level 0-2-1 and the downsampling polyphase filters as an example, using the downsampling polyphase filters of level 0-2-2 illustrated in FIG. 11A. The mixers in level 0-2-1 cancel out the shifting of the respectively applied signal by exactly 25% of its sampling frequency that took place in the transmitter. The complex mixing is again performed by a multiplication with a complex rotary term, which is:

$$dt[n] = \exp[j*2*\pi*\Delta f/f_s*n] \text{ wherein } j = sqrt(-1).$$

With a mixer $\Delta f = -f_s/4$ this vector is reduced to $[1; -j; -1; j]$. This means that the first, fifth, ninth, ... input values are always multiplied by $-1$, the second, sixth, tenth, ... inputs values are always multiplied by $-j$, the third, seventh, eleventh, ... input values are always multiplied by $-1$ and the fourth, eighth, twelfth, ... input values are always multiplied by $j$. As it may be seen from the above description, this $-f_s/4$ mixing may be realized by four simple operations. Similar to a polyphase filter, this block may operate internally at a quarter of the output data rate. The setup and the function of such an $f_s/4$ mixer has already been described in more detail in FIG. 10 and in the description corresponding to the same. Such a mixer described there may also be used for a mixing in the receiver when the parameters fs_shift_1 and fs_shift_2 and the conversion of the sampling rate are selected suitably.

In the following paragraph, the concrete conversion of the downsampling polyphase filters in level 0-2-2 illustrated in FIG. 11A is explained in more detail. With these downsampling polyphase filters in level 0-2-2, first a downsmapling of the signal to clock B_clock_4 and after a second $-f_s/4$ mixing a downsampling to clock B_clock_16 is achieved. With the downsampling operations by the factor 4 present in this embodiment, the respectively applied signal is filtered with a low pass in order to suppress the occurring image spectrums and then only pass on every fourth sample. Basically, the setup of a downsampling polyphase filter corresponds to the setup of a polyphase filter illustrated in FIG. 8, in which an upsampling is performed; here, some details are to be explained in more detail, however. For this purpose, in FIG. 14 a block diagram of an exemplary structure of a downsampling polyphase filter is illustrated, as it may be used in level 0-2-2 illustrated in FIG. 11A.

Figure 14:
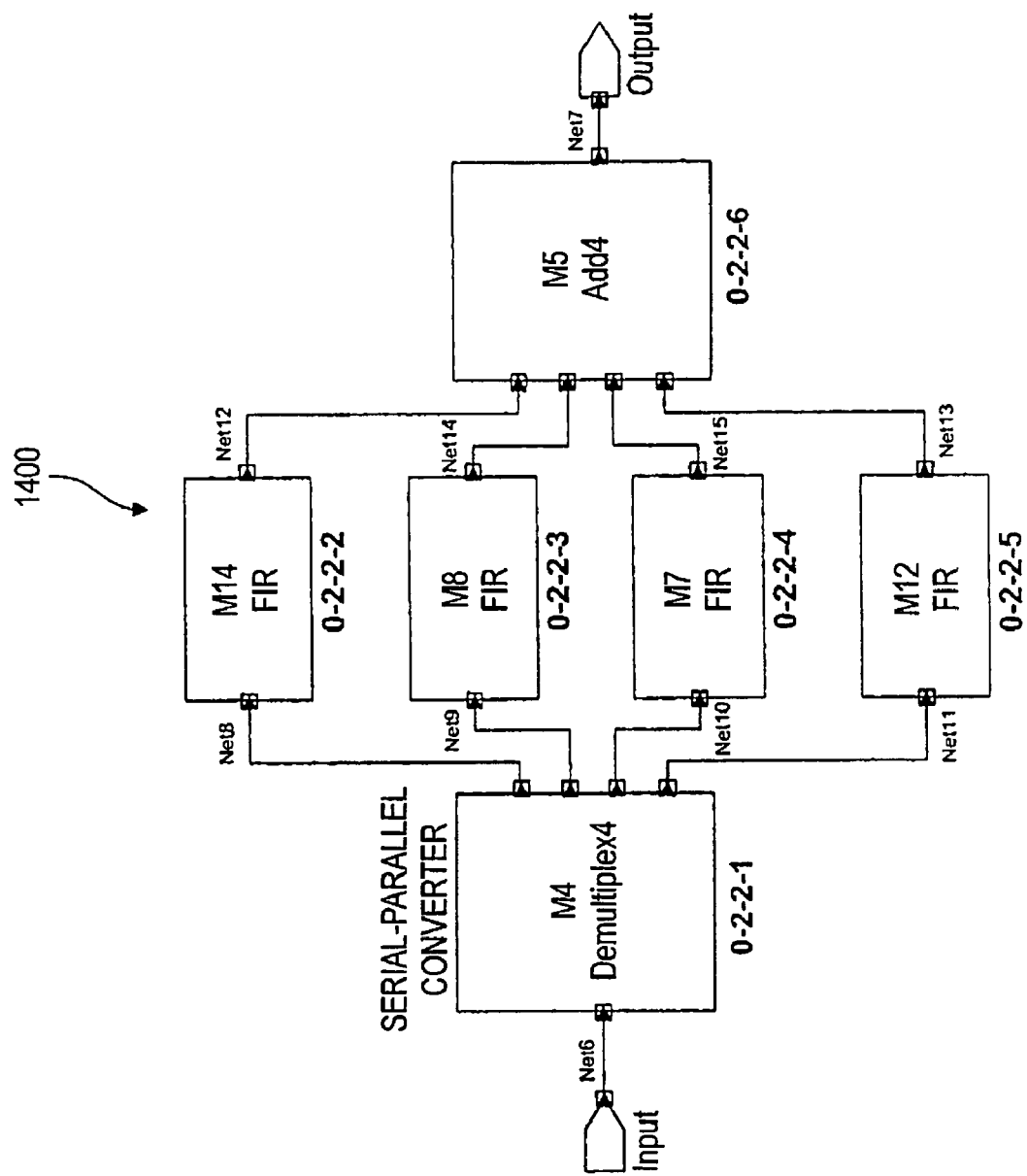
FIG. 14 shows a block diagram representing a detailed structure of a block illustrated in FIG. 11A.

FIG. 14 thus shows a downsampling polyphase filter 1400 comprising an input, a one-to-four demultiplexer 0-2-2-1 (serial parallel mixer), a first FIR filter 0-2-2-2, a second FIR filter 0-2-2-3, a third FIR filter 0-2-2-4, a fourth FIR filter 0-2-2-5, an adder 0-2-2-6 and an output. Each of the FIR filters 0-2-2-2 to 0-2-2-5 respectively includes one input and one output. An input of the one-to-four demultiplexer 0-2-2-1 is connected to the input of the downsampling polyphase filter 1400 via the signal Net6. A first output of the demultiplexer M4 is connected to the input of the first FIR filter M14 via the signal Net8. A second output of the demultiplexer M4 is connected to the second FIR filter M8 via the signal Net9. A third output of the demultiplexer M4 is connected to the third FIR filter M7 via the signal Net10 and a fourth output of the demultiplexer M4 is connected to the input of the fourth FIR filter M12 via the signal Net11. Further, a first input of the adder M5 is connected to the output of the first FIR filter M14 via the signal Net12, a second input of the adder M5 is connected to the second FIR filter M8 via the signal Net14, a third input of the adder M5 is connected to the output of the third FIR filter M7 and a fourth input of the adder M5 is connected to the output of the fourth FIR filter M12 via the signal Net13. Additionally, an output of the adder M5 is connected to the output of the downsampling polyphase filter 1400 via the signal Net7.

As it may be seen from FIG. 14, a low-pass filter required in level 0-2-2 may be realized with the help of a polyphase approach, as an FIR filter having the length L may be divided into R sub-filters of the length L/R, wherein L indicates the FIR filter length and R indicates the upsampling factor of a signal. To this end, the signal supplied to the downsampling polyphase filter 1400 via its input is divided into R=4 parallel signal streams in the demultiplexer M4, and thus the applied sample clock is quartered (i.e. for example brought from a sample clock of B_clock to B_clock_4 or from B_clock_r to B_clock_16, respectively). The individual signal streams (i.e. the signals Net8-Net11) are then respectively filtered using an FIR filter of the length L/4 and the results are transmitted to the adder M5 via the signals Net12-Net15. In the adder M5 a summation of the signal values of the signals Net12-Net15 takes place.

A word width, a data rate and a data type of the signals illustrated in FIG. 14 may be taken from the tabular illustration of FIG. 15. Here, it is to be noted that a word width depends on the used hardware components (in particular a word width of an analog/digital mixer used at the front end of the receiver). For this reason it may be said, that the word width is still to be defined depending on the use of the hardware components (i.e. in the column "word width" the designation tbd is inserted). Regarding the data rate it may be said, that the downsampling polyphase filter illustrated in FIG. 14 performs an operation that cancels out an operation performed by the (upsampling) filter illustrated in FIG. 8, whereby the reduction of the sampling rate of the signal Net6 with regard to the sampling rates of the signals Net7-Net15 may be explained. With regard to the data type it is to be noted that each of the illustrated signals is to be regarded as a complex signal.

Regarding the selection of the filter coefficients for the individual filters (i.e. the first FIR filter M14, the second FIR filter M8, the third FIR filter M7 and the fourth FIR filter M12) reference is made to the implementations regarding the filter illustrated in FIG. 8, wherein in particular the filter coefficients may be selected according to the tabular illustration in FIG. 9. Further, the fourth FIR filter M12, for the above-mentioned reasons, may again be selected as a delay element with a delay of 5 samples (i.e. the fourth FIR filter M12 may be implemented such that only a shift of the received input value by five elements takes place). Further, the second FIR filter M8 may be shortened based on the axially symmetrical structure and the even filter length, in order to at least halve the number of multiplications.

In the next section, a further embodiment of the inventive approach of the reduction of the sampling rates (i.e. the downconversion) is to be explained in more detail. To this end, as an example a sampling rate reduction by the rate factor 4 and a filtering using an FIR filter having six coefficients ($a_0, a_1, a_2, a_3, a_4$ and $a_5$) is selected. As an input sequence, the signal value sequence $x_9, x_8, x_7, x_6, x_5, x_4, x_3, x_2, x_1$ and $x_0$ is used, wherein $x_0$ is the first received signal or the first sample.

In FIG. 16, the temporal allocation of the input data x to the filter coefficients when using the FIR filter with six coefficients is illustrated. The filter output here, according to the FIR filter regulation, results in an output value FIR_out=$a_0*x_5+a_1*x_4+a_2*x_3+a_3*x_2+a_2+\ldots$ In the case of the assumed sampling rate reduction factor of R ) 4, only the value pairs with a dark background in the tabular illustration of FIG. 16 are used after the sampling rate reduction, all others are discarded.

If the lines with a dark backgound are extracted, then another illustration of the linking of the input values and the filter coefficients may be shown. Such an illustration is given in FIG. 17. The two right columns, i.e. the columns in which the filter coefficients $a_0$-$a_5$ are entered, now contain the coefficients in a different arrangement. The typical structures with FIR filters result, which are implemented in a polyphase structure. Each of the individual polyphases ("SUB FIR filter") consists of the coefficients of the original filter. The allocation is here performed according to the following scheme:

polyphase "1": $a_{0+i*rate\ factor}$
polyphase "2": $a_{1+i*rate\ factor}$
polyphase "3": $a_{2+i*rate\ factor}$
...
polyphase "rate factor": $a_{(rate\ factor-1)+i*rate\ factor}$ wherein i=0, 1, . . . .

In the above example, with a rate factor of R=4, this means the allocation of the filter coefficients $a_0$ and $a_4$ to polyphase 1, the filter coefficients $a_1$ and $a_5$ to polyphase 2, the filter coefficients $a_2$ and the value 0 to polyphase 3 and the filter coefficients $a_3$ and the value 0 to polyphase 4. Should the number of the coefficients of the FIR filter not be dividable by the integer rate factor, then the missing coefficients are replaced by the value 0, as it was performed with the polyphases 3 and 4.

Figure 18:
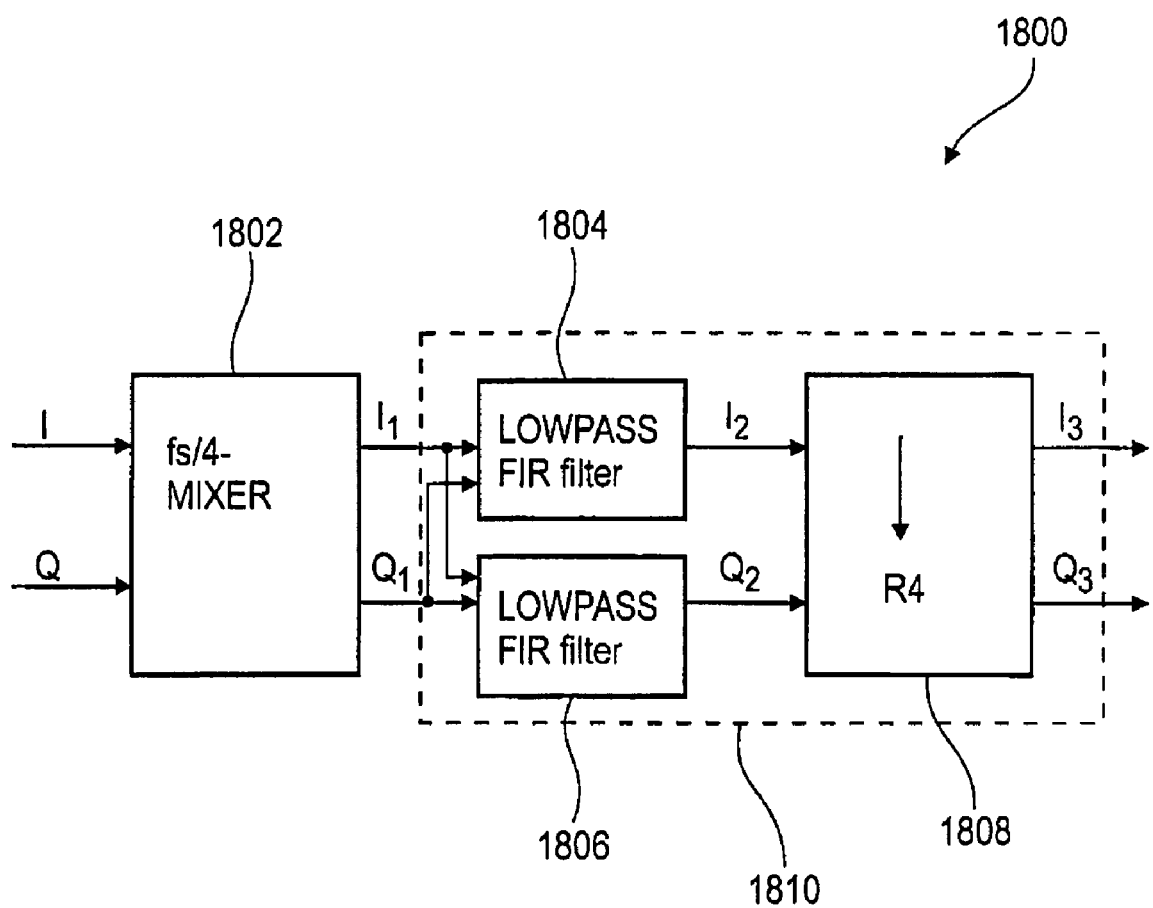
FIG. 18 is a block diagram of a further embodiment of the present invention.
Figure 24:
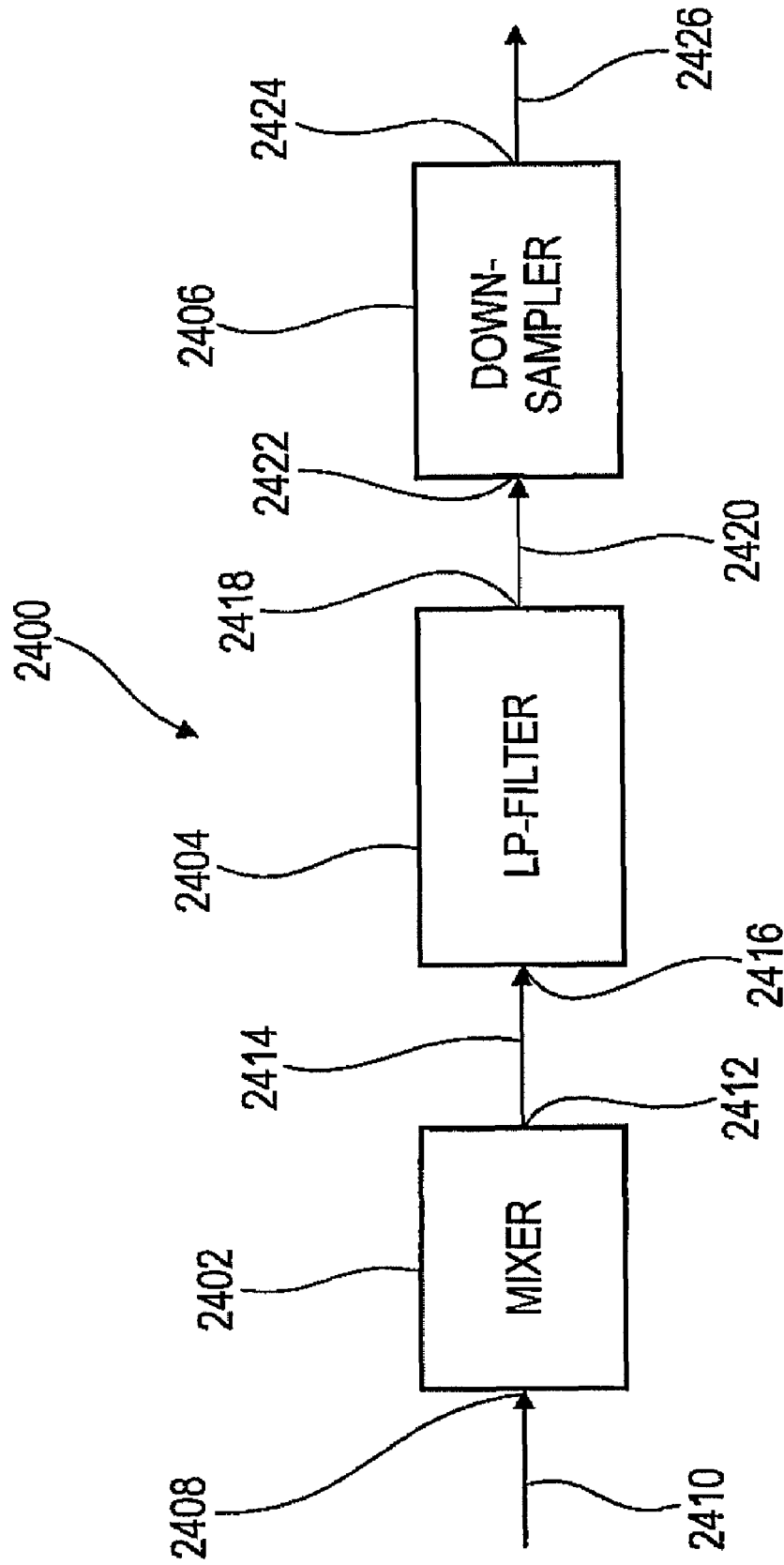
FIG. 24 shows a block diagram of a conventional signal mixer.

Such a polyphase filter structure may now effectively be used for a frequency shift by a quarter of the sampling frequency with a subsequent sampling rate reduction. FIG. 18 shows a block diagram of a mixer 1800, in which the principal functioning of the frequency shift of a complex signal with a subsequent sampling rate reduction by the factor R=4 is illustrated. The mixer 1800 includes an $f_s/4$ mixer 1802, a first low-pass filter 1804, a second low-pass filter 1806 and a sampling rate reduction unit 1808. The $f_s/4$ mixer 1802 includes a first input I for receiving an I component of a signal and a second input Q for receiving a Q component of a signal, wherein the Q component of the signal is orthogonal to the I component of the signal. Further, the $f_s/4$ mixer 1802 includes a first output for outputting an $I_1$ component of a mixed signal and a second output for outputting a $Q_1$ component of the mixed signal.

Further, the first low-pass filter 1804 comprises an input for receiving the $I_1$ component of the frequency-converted signal and an output for outputting an $I_2$ component of a low-pass-filtered frequency-converted signal. The second low-pass filter 1806 includes an input for receiving the $I_1$ component of the frequency-converted signal and an output for outputting a $Q_2$ component of a low-pass-filtered mixed signal. The sampling rate reduction unit 1808 includes a first input for receiving the $I_2$ component of the low-pass-filtered mixed signal and a second input for receiving the $Q_2$ component of the low-pass-filtered mixed signal. Further, the sampling rate reduction means 1808 includes a first output for outputting an $I_3$ component of a sampling-rate-reduced low-pass-filtered mixed signal and a second output for outputting a $Q_3$ component of a sampling-rate-reduced low-pass-filtered mixed signal.

The functioning of the mixer 1800 illustrated in FIG. 18 is described in more detail in the following. The following implementations here first relate to a polyphase filter realizing a functionality of block 1810 illustrated in FIG. 18. Here, by the polyphase filters to be realized, the functionality of the first low-pass filter 1804, the functionality of the second low-pass filter 1806 and the functionality of the sampling rate reduction means 1808 are to be provided. The two illustrated low-pass filters are here assumed to be identical.

If the values illustrated in FIG. 17 are used as (complex) input data x (=i+jq) for the mixer 1802 (i.e. the I component and the Q component), for example with a polyphase structure of the first low-pass filter 1804 an allocation of the real (i) and imaginary part values (q) of the input values illustrated in FIG. 17 according to the illustration in FIG. 19 results. The allocation of the real and imaginary part values i and q resulting from the input signal x to the frequency-converted signal with the components $I_1$ and $Q_1$ is done by the mixer 1802 which may perform a negation and/or exchange of real and imaginary part values of the input signal x to the frequency-converted signal $I_1$ and $Q_1$. It is further to be noted that the values illustrated in the table in FIG. 19 correspond to real part values, as they are listed in the tabular illustration in FIG. 4 for a positive frequency shift. The tabular illustration according to FIG. 19 thus represents the allocation of values to four different polyphases, if the first low-pass filter 1804 is implemented in a four-fold polyphase structure. The illustration in FIG. 19 thus shows how the real part with a polyphase structure of a signal shifted by $f_s/4$ may be calculated as an input signal. Here, the real or imaginary part values, respectively, weighted with the corresponding filter coefficients $a_0$ to $a_5$ of the individual polyphase part filters (polyphase1 to polyphase4) are summed up in order to obtain the filtered and downsampled output signal $I_3$.

If, analog to the above implementations, for the second low-pass filter 1806 also a polyphase structure is used, like the complex input data x illustrated in FIG. 17 with a real part i and an imaginary part q, then as a result an allocation of the real and imaginary parts of the individual samples x to the polyphases results according to the illustration in FIG. 20. Here it is shown that the values illustrated in FIG. 20 correspond to the real part values of the overview illustrated in FIG. 4 with a positive frequency shift. Further, the real or imaginary part values, respectively, weighted with the corresponding filter coefficients $a_0$ to $a_5$ of the individual polyphase sub-filters (polyphase1 to polyphase4) are summed up in order to obtain the filtered and downsampled output signal $Q_3$.

With a close view of the respective input data x of the filters, as they are obvious by the i and q values from the tables in FIGS. 19 and 20, it is obvious that at every point in time, i.e. at every time index n, the polyphases are "fed" only with i or with q data. Due to the independence of the individual polyphases, the same may be resorted. For a calculation of the real part and the imaginary part of the mixer 1800 illustrated in FIG. 18, then only the corresponding polyphase results have to be summed. By such an implementation, thus a low-pass filtering and a downsampling may be performed, by filtering the input values with the filter coefficients of the (low-pass) filter $a_0$ to $a_5$ and simultaneously performing the downsampling by the summation of the four polyphase results to form a final result.

According to the mixer 1800 illustrated in FIG. 18, thus by the use of two polyphase filters respectively including the functionality of the first low-pass filter and the sampler or the functionality of the second low-pass filter 1806 and the sampling rate mixer 1808, a clear simplification of the circuit structure may be realized. Thus, for example, the $I_3$ component, as it is illustrated in FIG. 18, may be realized from the summation of the individual results of the individual polyphases according to the illustration in FIG. 19, and the $Q_3$ component of the mixer 1800 illustrated in FIG. 18 may be realized by a summation of the partial results of the individual polyphases according to the summation in FIG. 20.

For repeated reference, it is to be noted here, that the signs of the input data x come from the upstream mixer. In FIG. 18, the data stream, consisting of the $I_1$ and the $Q_1$ components would thus have to be used as an input signal x for the low-pass filters. This in particular relates to the signs of the polyphases illustrated in FIGS. 19 and 20, polyphase 2 (im), polyphase 3 (re), polyphase 3 (im) and polyphase 4 (re). If the mixer is not present, however, the signs are omitted, or another frequency shift is selected, respectively, the signs in lines polyphase 2 (im) and polyphase 4 (im), and polyphase 2 (re) and polyphase 4 (re) are exchanged. Those signs may, however, be included in the corresponding polyphases themselves. This is in particular interesting when always one of the two frequency shifts is selected, i.e. when the corresponding coefficients are negated.

FIG. 21 shows such a negation of individual real part values i and imaginary part values q of the input signal values x, wherein simultaneously a reordering of the real and imaginary part values to individual polyphases of the different polyphase filter (i.e. the polyphase filter for the real part and the polyphase filter for the imaginary part) is performed. In the following, the polyphases of the FIR filter are designated by POLY_FIR_1, . . ., wherein the result of the first polyphase, i.e. of POLY_FIR_1 results as the sum of the input values weighted with the filter coefficients $a_0$ and $a_4$. For the second to fourth polyphase the above implementations also hold true. The outputs of the polyphase filters are designated by RE/IMAG_P_OUT_1 . . . 4. The inputs of the filters are represented by the real and imaginary part.

A general approach of the polyphase structure under consideration of an $f_s/4$ shift is shown in FIG. 22. Here again an allocation of the real and imaginary part values to the individual polyphases is illustrated. Further, the designation of the results of the individual polyphases by RE_P_OUT_1 . . . 4 and IM_P_OUT_1 . . . 4 is defined. On the basis of the results defined in FIG. 22 of the polyphase filters now three possibilities may regarded:

no frequency shift;

frequency shift in the positive direction; and frequency shift in the negative direction.

If no frequency shift is performed, a real part of the resulting (downsampled) signal which is, for example, the $I_3$ component of the mixer 1800 illustrated in FIG. 18, results by a summation of the results of the polyphases RE_P_OUT_1, RE_P_OUT_2, RE_P_OUT_3 and RE_P_OUT_4. Correspondingly, an imaginary part of the (downsampled) signal, for example corresponding to the $Q_3$ component of the mixer 1800 illustrated in FIG. 18, results by a summation of the results IM_P_OUT_1, IM_P_OUT_2, IM_P_OUT_3, IM_P_OUT_4.

If a frequency shift in the positive direction is selected, the real part (i.e. of the $I_3$ component) may be determined by a summation of the polyphase results RE_P_OUT_1, IM_P_OUT_2, —RE_P_OUT_3 and –IM_P_OUT_4, while the imaginary part (i.e. the $Q_3$ component) results from a summation of the polyphase results IM_P_OUT_1, —RE_P_OUT_2, —MP_OUT_3 and RE_P_OUT_4. If a frequency shift in the negative direction is desired, the real part may be determined by a summation of the polyphase results RE_P_OUT_1, —IM_P_OUT_2, —RE_P_OUT_3 and IM_P_OUT_4, whereas the imaginary part may be determined by a summation of the polyphase results IM_P_OUT_1, RE_P_OUT_2, —IM_P_OUT_3 and —RE_P_OUT_4.

An overview over the polyphase results to be summed for the realization of a frequency shift in the positive direction, a frequency shift in the negative direction and no frequency shift is illustrated in FIG. 23.

By this it may be seen that already by a polyphase filter structure having a corresponding negation and reordering possibility, a mixer may be realized offering all functionalities of the mixer 1800 illustrated in FIG. 18, in particular of frequency mixing, low-pass filtering and downsampling. This enables performing the negation and reordering as well as the weighting using filter coefficients for realizing the low-pass filtering in any order, which results in a further flexibilization and thus in a further improvement of the applicability of the mixer. Further, by this additional flexibilization also simplifications in the circuit design or in the numerical complexity may be achieved, as now no strict adherence to the order of the individual steps is necessary, but rather a more efficient implementation in terms of circuit engineering or numerics of the $f_s/4$ mixing is enabled.

Depending on the conditions, the inventive method for mixing a signal may be implemented in hardware or in software. The implementation may be performed on a digital storage medium, in particular a floppy disc or a CD with electronically readable control signals which may cooperate with a programmable computer system so that the corresponding method is performed. In general, the invention thus also consists in a computer program product having a program code stored on a machine-readable carrier for performing the inventive method when the computer program product runs on a computer. In other words, the invention may thus be realized as a computer program having a program code for performing the method when the computer program runs on a computer.

As a conclusion it may be said, that the digital mixing for a tuning of frequency-hopping is conventionally performed with one single digital mixer stage, wherein no cascading of several mixer stages and no sampling rate conversion (UP-/DOWN-sampling) is required. Such a mixing with one single digital mixer stage has the disadvantage, however, that for the case of an unfavorable mixing ratio (i.e. a mixing not with a quarter of the sampling frequency) a substantial effort regarding numerics or circuit engineering, respectively, is required. Conventionally, for example broadcasting standards also do not comprise the required frequency raster for this mixing using the quarter sampling frequency. By this, the inventive approach offers a simplification when mixing with the quarter sampling frequency, as only the coefficients ±1 (the real and imaginary parts of an input signal) and 0 are to be considered and thus by a suitable sampling rate conversion almost any desired target frequency may be obtained. For this reason, the inventive approach offers clearly better characteristics with regard to the implementability regarding numerics or circuit engineering, and also with regard to an applicability of individual frequency subbands. Further, the inventive approach also comprises improved characteristics with regard to a processing speed of the mixing, as a negation or re-sorting may be performed clearly faster than, for example, a complex multiplication.

With regard to a parallel sending and receiving it is further to be noted that such a sending and receiving requires no sampling rate conversion and no cascading. It is to be noted, however, that in particular with the OFDM method frequency subbands overlap. In general, an OFDM signal looks different to a signal generated using the system presented here. In particular, the spectrum in the OFDM method is so-to-speak white; in contrast to that, in the system proposed here the used frequency subbands are clearly visible. In the proposed system this results in a clearly reduced interference of the unused frequency bands, as the signal will be transmitted only on a frequency band which may be selected by a corresponding parameter setting. Further, in the OFDM method, based on the underlying FFT, always a block or frame structure, respectively, including a required frame synchronization is necessary, which increases an effort for guaranteeing the frame synchronization, which in the following leads to a higher expense with regard to numerics or circuit engineering. Apart from that, with dispersive channels (i.e. channels with multipath propagation) a guard interval is required which has a data rate-reducing effect. In the system proposed here, however, neither a frame synchronization nor a guard interval is required.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A mixer device for mixing a signal, representing a sequence of time-discrete values with a time interval between two time-discrete values defining a first sampling frequency, from a current frequency to a target frequency, comprising:
    a first mixer which is implemented to convert the signal from the current frequency to an intermediate frequency to obtain an intermediate frequency signal which is based on the first sampling frequency, wherein a spectral interval between the intermediate frequency and the current frequency depends on the first sampling frequency;
    wherein the first mixer comprises a controller having a control input, wherein the controller is implemented to cause, in response to a signal applied to the control input in the first mixer, an increase or a decrease of the intermediate frequency with regard to the current frequency or no frequency conversion of the intermediate frequency with regard to the current frequency in the first mixer;
    a converter for converting the intermediate frequency signal into a converted intermediate frequency signal which is based on a second sampling frequency, wherein the first sampling frequency and the second sampling frequency are different from each other; and
    a second mixer which is implemented to convert the converted intermediate frequency signal from the intermediate frequency to the target frequency to obtain a target frequency signal which is based on the second sampling frequency, wherein a spectral interval between the target frequency and the intermediate frequency depends on the second sampling frequency;
    wherein the signal includes four consecutive signal values, wherein the first mixer includes a demultiplexer for allocating one signal value each into one of four processing paths arranged in parallel, wherein in each processing path a processor for determining a result of a multiplication of a signal value by a multiplication factor from a set of multiplication factors is arranged, and wherein the first mixer is implemented, in response to a signal at the control input, to select a set of multiplication factors associated with the signal from a plurality of sets of multiplication factors.

2. The mixer device according to claim 1, wherein the first mixer is implemented to set the spectral interval between the intermediate frequency and the current frequency to a quarter of the first sampling frequency, and wherein the second mixer is implemented to set the spectral interval between the target frequency and the intermediate frequency to a quarter of the second sampling frequency.

3. The mixer device according to claim 1, wherein the converter for converting is implemented to convert the intermediate frequency signal into a converted intermediate frequency signal, which is based on the second sampling frequency, wherein the second sampling frequency is higher than the first sampling frequency.

4. The mixer device according to claim 3, wherein the intermediate frequency signal includes a first intermediate frequency signal value and a second intermediate frequency signal value following in time after the first intermediate frequency signal value, wherein the converter for converting is implemented to insert a further intermediate frequency signal value which has the value of 0 between the first and the second intermediate frequency signal value to obtain the converted intermediate frequency signal.

5. The mixer device according to claim 1, wherein the converter for converting is implemented to convert the intermediate frequency signal into a converted intermediate frequency signal which is based on the second sampling frequency, wherein the second sampling frequency is lower than the first sampling frequency.

6. The mixer device according to claim 5, wherein the signal includes an I component having a plurality of I component values and a Q component, orthogonal to the I component, having a plurality of Q component values, wherein the first mixer includes a converter for converting which is implemented to convert a first sequence corresponding to the I component having a first, second, third and fourth sequential member and a second sequence corresponding to the Q component having a first, second, third and fourth sequential member according to a predetermined processing regulation into a third sequence having a first, second, third and fourth sequential member and a fourth sequence having a first, second, third and fourth sequential member, wherein the sequential members of the third sequence correspond to values of an I component of the intermediate frequency signal and the sequential members of the fourth sequence correspond to values of a Q component of the intermediate frequency signal, wherein the predetermined processing regulation depends on the signal applied to the control input.

7. The mixer device according to claim 6, wherein the converter for converting is implemented, according to the predetermined processing regulation, to negate a sequential member of the first or second sequence in order to obtain a sequential member of the third or fourth sequence.

8. The mixer device according to claim 7, wherein the converter for converting is implemented, according to the predetermined processing regulation, to allocate a negated sequential member of the first sequence to a sequential member of the fourth sequence and to allocate a negated sequential member of the second sequence to a sequential member of the third sequence.

9. The mixer device according to claim 7, wherein the first mixer is implemented, according to the signal applied to the control input, to cause a decrease of the intermediate frequency with regard to the current frequency, wherein the converter for converting is implemented to allocate the first sequential member of the first sequence to the first sequential member of the third sequence, the first sequential member of the second sequence to the first sequential member of the fourth sequence, the negated second sequential member of the first sequence to the second sequential member of the fourth sequence, the second sequential member of the second sequence to the second sequential member of the third sequence, the negated third sequential member of the first sequence to the third sequential member of the third sequence, the negated third sequential member of the second sequence to the third sequential member of the fourth sequence, the negated fourth sequential member of the second sequence to the fourth sequential member of the third sequence and the fourth sequential member of the first sequence to the fourth sequential member of the fourth sequence.

10. The mixer device according to claim 7, wherein the first mixer is implemented, according to the signal applied to the control input, to cause no frequency conversion of the intermediate frequency with regard to the current frequency, wherein the converter for converting is implemented to allocate the first sequential member of the first sequence to the first sequential member of the third sequence, the second sequential member of the first sequence to the second sequential member of the third sequence, the third sequential member of the first sequence to the third sequential member of the third sequence, the fourth sequential member of the first sequence to the fourth sequential member of the third sequence, the first sequential member of the second sequence to the first sequential member of the fourth sequence, the second sequential member of the second sequence to the second sequential member of the fourth sequence, the third sequential member of the second sequence to the third sequential member of the fourth sequence, the fourth sequential member of the second sequence to the fourth sequential member of the fourth sequence.

11. The mixer device according to claim 7, wherein the first mixer is implemented, according to the signal applied to the control input, to cause an increase of the intermediate frequency with regard to the current frequency, wherein the converter for converting is implemented to allocate the first sequential member of the first sequence to the first sequential member of the third sequence, the first sequential member of the second sequence to the first sequential member of the fourth sequence, the second sequential member of the first sequence to the second sequential member of the fourth sequence, the negated second sequential member of the second sequence to the second sequential member of the third sequence, the negated third sequential member of the first sequence to the third sequential member of the third sequence, the negated third sequential member of the second sequence to the third sequential member of the fourth sequence, the fourth sequential member of the second sequence to the fourth sequential member of the third sequence and the negated fourth sequential member of the first sequence to the fourth sequential member of the fourth sequence.

12. The mixer device according to claim 1, wherein the second mixer comprises a controller having a control input, wherein the controller is implemented, in response to a signal applied to the control input, to cause in the second mixer an increase or a decrease of the target frequency with regard to the intermediate frequency or to cause no frequency conversion of the intermediate frequency with regard to the intermediate frequency in the second mixer.

13. The mixer device according to claim 1, further including:
a third mixer which is implemented to convert the signal from the current frequency to a further intermediate frequency to obtain a further intermediate frequency signal which is based on the first sampling frequency, wherein a spectral interval between the intermediate frequency and the current frequency depends on the first sampling frequency and wherein the intermediate frequency is different from the further intermediate frequency.

14. The mixer device according to claim 1, wherein the first mixer comprises a first controller and the second mixer comprises a second controller, wherein the first controller is implemented to cause a first frequency conversion and wherein the second controller is implemented to cause a second frequency conversion, wherein a frequency conversion includes a frequency increase, a frequency decrease or no frequency change, and wherein the first frequency conversion is different from the second frequency conversion.

15. The mixer device according to claim 1, wherein the converter for converting includes a low-pass filter.

16. The mixer device according to claim 15, wherein the intermediate frequency signal includes an I component and a Q component orthogonal to the I component, and wherein the low-pass filter includes a first low-pass subfilter and a second low-pass subfilter, wherein the first low-pass subfilter is implemented to filter the I component and the second low-pass subfilter is implemented to filter the Q component, and wherein the first low-pass subfilter and the second low-pass subfilter comprise real-valued filter coefficients.

17. The mixer device according to claim 16, wherein the first low-pass subfilter comprises a first filter coefficient set and the second low-pass subfilter comprises a second filter coefficient set, wherein the first filter coefficient set corresponds to the second filter coefficient set.

18. The mixer device according to claim 15, wherein the first low-pass subfilter includes a polyphase filter for providing a first, second, third and fourth polyphase filter signal, which are different from each other, and wherein the second low-pass subfilter includes a polyphase filter for providing a fifth, sixth, seventh and eighth polyphase filter signal, wherein the fifth, sixth, seventh and eighth polyphase filter signals are different from each other, and wherein the converter for converting further includes a provider for providing a first and second output signal, wherein a provider for providing is implemented to sum four of the polyphase filter signals in order to provide the first output signal and to sum four further polyphase filter signals not considered when providing the first output signal in order to obtain the second output signal.

19. A mixer device according to claim 1 wherein the second mixer is a mixer, comprising:
a first sub-mixer which is implemented to convert the converted intermediate frequency signal from the intermediate frequency to a second intermediate frequency to obtain a second intermediate frequency signal which is based on the second sampling frequency, wherein a spectral interval between the intermediate frequency and the second intermediate frequency depends on the second sampling frequency;
further the converter for converting the second intermediate frequency signal into a second converted intermediate frequency signal based on a third sampling frequency, wherein the third sampling frequency and the second sampling frequency are different from each other; and
a second sub-mixer which is implemented to convert the second converted intermediate frequency signal from the second intermediate frequency to the target frequency to obtain a target frequency signal based on the third sampling frequency, wherein a spectral interval between the target frequency and the intermediate frequency depends on the third sampling frequency.

20. A mixer device according to claim 1,
wherein a spectral interval between the intermediate frequency and the current frequency corresponds to a quarter of the first sampling frequency or is equal to zero,
wherein a spectral interval between the target frequency and the intermediate frequency corresponds to a quarter of the second sampling frequency;
wherein the first mixer comprises a controller having a control input,
wherein the controller is implemented to cause, in response to a signal applied to the control input in the first mixer, an increase or a decrease of the intermediate frequency with regard to the current frequency or no frequency conversion of the intermediate frequency with regard to the current frequency in the first mixer,
wherein the signal includes four consecutive signal values, wherein the first mixer includes a demultiplexer for allocating one signal value each into one of four processing paths arranged in parallel, wherein in each processing path a processor for determining a result of a multiplication of a signal value by a multiplication factor from a set of multiplication factors is arranged, and
wherein the first mixer is implemented to select, in response to a signal at the control input, a set of multiplication factors associated with the signal from a plurality of sets of multiplication factors.

21. A mixer device for mixing a signal, representing a sequence of time-discrete values with a time interval between two time-discrete values defining a first sampling frequency, from a current frequency to a target frequency, comprising:
a first mixer which is implemented to convert the signal from the current frequency to an intermediate frequency to obtain an intermediate frequency signal which is based on the first sampling frequency, wherein a spectral interval between the intermediate frequency and the current frequency depends on the first sampling frequency;
a converter for converting the intermediate frequency signal into a converted intermediate frequency signal which is based on a second sampling frequency, wherein the first sampling frequency and the second sampling frequency are different from each other; and
a second mixer which is implemented to convert the converted intermediate frequency signal from the intermediate frequency to the target frequency to obtain a target frequency signal which is based on the second sampling frequency, wherein a spectral interval between the target frequency and the intermediate frequency depends on the second sampling frequency;
wherein the second mixer comprises a controller having a control input, wherein the controller is implemented to cause, in response to a signal applied to the control input in the second mixer, an increase or a decrease of the intermediate frequency with regard to the current frequency or no frequency conversion of the intermediate frequency with regard to the current frequency in the second mixer;
wherein the target frequency signal includes four consecutive signal values, wherein the second mixer includes a demultiplexer for allocating one signal value each into one of four processing paths arranged in parallel, wherein in each processing path a processor for determining a result of a multiplication of a signal value by a multiplication factor of a set of multiplication factors is arranged, and wherein the second mixer is implemented, in response to a signal at the control input, to select a set of multiplication factors associated with the signal from a plurality of sets of multiplication factors.

22. The mixer device according to claim 21, wherein the converted intermediate frequency signal includes an I component having a plurality of I component values and a Q component orthogonal to the I component having a plurality of Q component values, wherein the second mixer includes a converter for converting which is implemented to convert a first sequence corresponding to the I component having a first, second, third and fourth sequential member and a second sequence corresponding to the Q component having a first, second, third and fourth sequential member according to a predetermined processing regulation into a third sequence having a first, second, third and fourth sequential member and a fourth sequence having a first, second, third and fourth sequential member, wherein the sequential members of the third sequence correspond to values of an I component of the target frequency signal and the sequential members of the fourth sequence correspond to values of a Q component of the target frequency signal, wherein the predetermined processing regulation is dependent on the signal applied to the control input.

23. The mixer device according to claim 22, wherein the converter for converting is implemented, according to the predetermined processing regulation, to negate a sequential member of the first or second sequence in order to obtain a sequential member of the third of fourth sequence.

24. The mixer device according to claim 23, wherein the converter for converting is implemented, according to the predetermined processing regulation, to allocate a negated sequential member of the first sequence to a sequential member of the fourth sequence and a negated sequential member of the second sequence to a sequential member of the third sequence.

25. The mixer device according to claim 23, wherein the second mixer is implemented, according to the signal applied to the control input, to cause a decrease of the target frequency with regard to the intermediate frequency, wherein the converter for converting is implemented to allocate the first sequential member of the first sequence to the first sequential member of the third sequence, the first sequential member of the second sequence to the first sequential member of the fourth sequence, the negated second sequential member of the first sequence to the second sequential member of the fourth sequence, the second sequential member of the second sequence to the second sequential member of the third sequence, the negated third sequential member of the first sequence to the third sequential member of the third sequence, the negated third sequential member of the second sequence to the third sequential member of the fourth sequence, the negated fourth sequential member of the second sequence to the fourth sequential member of the third sequence and the fourth sequential member of the first sequence to the fourth sequential member of the fourth sequence.

26. The mixer device according to claim 23, wherein the second mixer is implemented, according to the signal applied to the control input, to cause no frequency conversion of the target frequency with regard to the intermediate frequency, wherein the converter for converting is implemented to allocate the first sequential member of the first sequence to the first sequential member of the third sequence, the second sequential member of the first sequence to the second sequential member of the third sequence, the third sequential member of the first sequence to the third sequential member of the third sequence, the fourth sequential member of the first sequence to the fourth sequential member of the third sequence, the first sequential member of the second sequence to the first sequential member of the fourth sequence, the second sequential member of the second sequence to the second sequential member of the fourth sequence, the third sequential member of the second sequence to the third sequential member of the fourth sequence, the fourth sequential member of the second sequence to the fourth sequential member of the fourth sequence.

27. The mixer device according to claim 23, wherein the second mixer is implemented, according to the signal applied to the control input, to cause an increase of the target frequency with regard to the intermediate frequency, wherein the converter for converting is implemented to allocate the first sequential member of the first sequence to the first sequential member of the third sequence, the first sequential member of the second sequence to the first sequential member of the fourth sequence, the second sequential member of the first sequence to the second sequential member of the fourth sequence, the negated second sequential member of the second sequence to the second sequential member of the third sequence, the negated third sequential member of the first sequence to the third sequential member of the third sequence, the negated third sequential member of the second sequence to the third sequential member of the fourth sequence, the fourth sequential member of the second sequence to the fourth sequential member of the third sequence and the negated fourth sequential member of the first sequence to the fourth sequential member of the fourth sequence.

28. The mixer device according to claim 27, wherein the low-pass filter is a polyphase filter, wherein the polyphase filter is implemented to determine, from the intermediate frequency signal, a plurality of different polyphase filter output signals.

29. The mixer device according to claim 28, wherein the polyphase filter is implemented to determine a predetermined number of polyphase signals from the signal, wherein the predetermined number of polyphase signals is dependent on a ratio of the first sampling frequency to the second sampling frequency.

30. A method for mixing a signal present as a sequence of time-discrete values with a time interval between two time-discrete values defining a first sampling frequency, from a current frequency to a target frequency, comprising the following steps to be performed by a mixer device;
  converting the signal from the current frequency to an intermediate frequency to obtain the intermediate frequency signal which is based on the first sampling frequency, wherein a spectral interval between the intermediate frequency and the current frequency depends on the first sampling frequency;
  converting the intermediate frequency signal into a converted intermediate frequency signal, wherein the first sampling frequency is different from the second sampling frequency; and
  converting the converted intermediate frequency signal from the intermediate frequency to the target frequency to obtain a target frequency signal which is based on the second sampling frequency, wherein a spectral interval between the target frequency and the intermediate frequency depends on the second sampling frequency;
  wherein a spectral interval between the intermediate frequency and the current frequency corresponds to a quarter of the first sampling frequency or is equal to zero;
  wherein a spectral interval between the target frequency and the intermediate frequency corresponds to a quarter of the second sampling frequency;
  wherein the converted intermediate frequency signal is based on the second sampling frequency;
  wherein the signal includes four consecutive signal values; and
  wherein converting the signal from the current frequency ($f_0$) to the intermediate frequency comprises assigning one signal value each to the one of four processing paths disposed in parallel;
  wherein in every processing path, a result of a multiplication of a signal value with a multiplication factor is determined from a set of multiplication factors;
  wherein converting the signal from the current frequency ($f_0$) to the intermediate frequency in dependence on a control signal comprises effecting an increase or a decrease of the intermediate frequency with regard to the current frequency or no frequency conversion with regard to the current frequency; and
  wherein converting the signal from the current frequency ($f_0$) to the intermediate frequency comprises selecting a set of multiplication factors from a plurality of sets of multiplication factors in dependence on the control signal.

31. Mixer device (100) for mixing a signal ($S_{1A}$) present as a sequence of time-discrete values (x) with a time interval ($T_A$) between two time-discrete values defining a first sampling frequency ($f_{s1}$), from a current frequency ($f_0$) to a target frequency, comprising:
  a polyphase filter structure, which is implemented to realize a first mixer, which provides frequency conversion, low-pass filtering and sub sampling,
  wherein the polyphase filter structure is implemented to convert the signal ($S_{1A}$) from the current frequency to an intermediate frequency, to obtain a converted intermediate frequency signal (ZFS2A), wherein a spectral interval between the intermediate frequency and the sampling frequency corresponds to a quarter of the sampling frequency or is equal to zero;
  wherein the polyphase filter structure is implemented to generate the converted intermediate frequency signal such that the converted intermediate frequency is based on a second sampling frequency (Fs2) wherein the first sampling frequency (Fs1) and the second sampling frequency (fs2) differ; and
  a second mixer (106), which is implemented to convert the converted intermediate frequency signal ($ZFS_{2A}$) from the intermediate frequency to the target frequency, to obtain a target frequency signal ($ZS_{2A}$), which is based on a second sampling frequency ($f_{s2}$), wherein a spectral interval between the target frequency and the intermediate frequency corresponds to a quarter of the second sampling frequency ($f_{s2}$),
  wherein the polyphase filter structure comprises a first low-pass subfilter and a second low-pass subfilter, wherein the first low-pass subfilter comprises a polyphase filter for providing a first, second, third and fourth polyphase filter signal, which are different to each other, and wherein the second low-pass subfilter comprises a polyphase filter for providing a fifth, sixth, seventh and eight polyphase signal, wherein the fifth, sixth, seventh and eight polyphase filter signal are different to each other, and
  wherein the polyphase filter structure further comprises a means for providing a first and second output signal, wherein the polyphase filter structure is implemented to sum four of the polyphase filter signals, to provide the first output signal, and to sum for further polyphase filter signals not considered in providing the first output signal, to obtain the second output signal, wherein the first mixer (102) comprises a control means with a control input, wherein the control means with a control input, wherein the control means is implemented to effect an increase or decrease of the intermediate frequency with regard to the current frequency ($f_0$), in response to a signal applied to the control input into the first mixer (102), or to effect no frequency conversion of the intermediate frequency with regard to the current frequency ($f_0$) in the first mixer (102), wherein the polyphase filter structure is implemented to determine an association which polyphase filter signals are summed for providing the first output signal (I3), and an association which polyphase filter signals are summed for providing the second output signal (Q3), in dependence on whether in the first mixer no frequency conversion with regard to the current frequency, an increase of the intermediate frequency with regard to the current frequency or a decrease of the intermediate frequency with regard to the current frequency is selected.

32. Method for mixing a signal (S1A) present as a sequence of time-discrete values (x) with a time interval ($T_A$) between two time-discrete values defining a first sampling frequency ($f_{s1}$), from a current frequency ($f_0$) to a target frequency, comprising the following steps to be performed by a mixer device:

providing polyphase filtering, which is implemented to realize a first mixture, which provides frequency conversion, low-pass filtering and sub-sampling, wherein polyphase filtering is implemented to convert the signal ($S_{1A}$) from the current frequency to an intermediate frequency, to obtain a converted intermediate frequency signal (ZFS2A), wherein a spectral interval between the intermediate frequency and the sampling frequency corresponds to a quarter of the sampling frequency or is equal to zero;

wherein polyphase filtering is implemented to generate the converted intermediate frequency signal, such that the converted intermediate frequency signal is based on a second sampling frequency (fs2), wherein the first sampling frequency (fs1) and the second sampling frequency (fs2) are different to each other; and providing a second mixture, which is implemented to convert the converted intermediate frequency signal ($ZFS_{2A}$) from the intermediate frequency to the target frequency, to obtain a target frequency signal ($ZS_{2A}$), which is based on a second sampling frequency (fs2), wherein a spectral interval between the target frequency and the intermediate frequency corresponds to a quarter of the second sampling frequency (fs2);

wherein polyphase filtering comprises first low-pass subfiltering and second low-pass subfiltering, wherein the first low-pass subfiltering comprises polyphase filtering for providing a first, second, third and fourth polyphase filter signal, which are different to each other, and wherein the second low-pass subfiltering comprises polyphase filtering for providing a fifth, sixth, seventh and eight polyphase filter signal, wherein the fifth, sixth, seventh and eight polyphase signals are different to each other, and wherein polyphase filtering further comprises providing a first and second output signal, wherein the polyphase filtering is implemented to sum four of the polyphase filter signals, to provide the first output signal, and to sum four further polyphase filter signals not considered when providing the first output signal, to obtain the second output signal, wherein the first mixture (102) comprises an increase or decrease of the intermediate frequency with regard to the current frequency ($S_0$) in dependence on a control signal, or no frequency conversion of the intermediate frequency with regard to the current frequency ($f_0$), wherein polyphase filtering is implemented to determine an association which polyphase filter signals are summed for providing the first output signal (I3) and an association which polyphase filter signals are summed for providing the second output signal (Q3), in dependence on whether in the first mixture no frequency conversion with regard to the current frequency, an increase of the intermediate frequency with regard to the current frequency or a decrease of the intermediate frequency with regard to the current frequency is selected.

* * * * *